(12) United States Patent
Kimtee

(10) Patent No.: US 12,428,724 B2
(45) Date of Patent: *Sep. 30, 2025

(54) CONTAMINANT TRAP SYSTEM FOR A REACTOR SYSTEM

(71) Applicant: ASM IP Holding B.V., Almere (NL)

(72) Inventor: Ankit Kimtee, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 438 days.

This patent is subject to a terminal disclaimer.

(21) Appl. No.: 17/825,460

(22) Filed: May 26, 2022

(65) Prior Publication Data

US 2022/0384063 A1   Dec. 1, 2022

Related U.S. Application Data

(60) Provisional application No. 63/194,721, filed on May 28, 2021.

(51) Int. Cl.
*C23C 16/44* (2006.01)
*B01D 45/08* (2006.01)
(Continued)

(52) U.S. Cl.
CPC .......... *C23C 16/4412* (2013.01); *B01D 45/08* (2013.01); *B01J 4/001* (2013.01);
(Continued)

(58) Field of Classification Search
CPC ........ B01D 46/04; B01D 45/08; B01J 19/006; B01J 4/001; B08B 15/00; B08B 15/04
(Continued)

(56) References Cited

U.S. PATENT DOCUMENTS 1,203,007 A * 10/1916 Kegler ................... B65D 88/06
                                                                237/78 R
1,746,774 A *  2/1930 Jenkins ................. B05B 7/2491
                                                                  55/485
(Continued)

FOREIGN PATENT DOCUMENTS

CA          2969589 A1    8/2017
CN          1257838 C     5/2006
(Continued)

OTHER PUBLICATIONS

USPTO; Non-Final Office Action dated Jun. 28, 2023 in U.S. Appl. No. 17/159,488.
(Continued)

*Primary Examiner* — Duane Smith
(74) *Attorney, Agent, or Firm* — Snell & Wilmer L.L.P.

(57) ABSTRACT

A contaminant trap system of a reactor system may include a baffle plate stack including at least one baffle plate having an aperture spanning through a baffle plate body of the baffle plate, and a body portion; and at least one complementary baffle plate having a complementary aperture spanning through a complementary baffle plate body of the complementary baffle plate, and a complementary body portion. The at least one baffle plate and the at least one complementary baffle plate may be disposed in a baffle plate order between a first end and a second end of the baffle plate stack in which the baffle plates alternate with the complementary baffle plates, such that no two baffle plates or no two complementary baffle plates are adjacent in the baffle plate order. The at least one baffle plate may include a sintered material.

18 Claims, 15 Drawing Sheets

(51) Int. Cl.
  *B01J 4/00* (2006.01)
  *B01J 19/00* (2006.01)
  *B08B 15/00* (2006.01)
  *B08B 15/04* (2006.01)
  *H01L 21/67* (2006.01)

(52) U.S. Cl.
  CPC ............ *B01J 19/006* (2013.01); *B08B 15/00* (2013.01); *B08B 15/04* (2013.01); *H01L 21/67017* (2013.01)

(58) Field of Classification Search
  USPC .......... 55/521, 523, 524, 529; 210/496, 487, 210/492
  See application file for complete search history.

(56) References Cited

U.S. PATENT DOCUMENTS

| | | | |
|---|---|---|---|
| 1,767,089 A * | 6/1930 | Miller | C09C 1/56 95/218 |
| 1,857,348 A * | 5/1932 | Bokenkroger | B01D 46/00 55/524 |
| 2,252,242 A * | 8/1941 | Wood | B01D 45/08 55/440 |
| 3,137,551 A | 6/1964 | Mark | |
| 3,606,738 A * | 9/1971 | Kraus et al. | B01D 3/20 55/465 |
| 3,779,221 A | 12/1973 | Gartner | |
| 3,795,091 A * | 3/1974 | Rennie | B01D 45/08 55/440 |
| 3,917,458 A * | 11/1975 | Polak | B01D 46/38 110/211 |
| 3,950,152 A * | 4/1976 | Guon | B01D 46/0031 976/DIG. 266 |
| 4,488,887 A * | 12/1984 | Angel | B01D 8/00 55/DIG. 15 |
| 5,788,747 A * | 8/1998 | Horiuchi | B01D 50/00 118/723 VE |
| 5,904,757 A * | 5/1999 | Hayashi | B01D 45/08 55/446 |
| 5,928,426 A * | 7/1999 | Aitchison | F23G 7/06 55/440 |
| 6,156,107 A * | 12/2000 | Hayashi | B01D 45/08 438/905 |
| 6,547,844 B2 * | 4/2003 | Rikyuu | B01D 45/08 55/DIG. 15 |
| 6,554,879 B1 * | 4/2003 | Nomura | C23C 16/4412 55/385.2 |
| 6,669,750 B2 * | 12/2003 | Liao | B01D 46/88 96/400 |
| 6,966,936 B2 * | 11/2005 | Yamasaki | C23C 16/4412 55/DIG. 15 |
| 7,727,296 B2 * | 6/2010 | Tojo | B01D 45/06 438/905 |
| 7,927,395 B2 | 4/2011 | Szepessy et al. | |
| 8,657,942 B2 * | 2/2014 | Shaw | C23C 16/4412 96/417 |
| 9,057,388 B2 * | 6/2015 | Comeau | C23C 16/50 |
| 9,410,247 B2 * | 8/2016 | Lee | C23C 16/4583 |
| 9,896,761 B2 * | 2/2018 | Hara | C23C 16/4412 |
| 10,337,103 B2 * | 7/2019 | Hyon | C23C 16/45578 |
| 11,173,439 B2 * | 11/2021 | Cho | H01L 21/67017 |
| 11,872,515 B2 * | 1/2024 | Cho | C23C 16/4412 |
| 11,872,516 B2 * | 1/2024 | Cho | B01D 50/20 |
| 2001/0003892 A1 | 6/2001 | Rikyuu | |
| 2002/0084185 A1 | 7/2002 | Sundberg | |
| 2002/0134244 A1 * | 9/2002 | Gu | B01D 45/08 55/423 |
| 2004/0166037 A1 | 8/2004 | Youdell | |
| 2009/0313996 A1 | 12/2009 | Riley et al. | |
| 2010/0011723 A1 * | 1/2010 | Szepessy | B01D 45/14 55/438 |
| 2011/0097772 A1 | 4/2011 | Huang et al. | |
| 2011/0252969 A1 | 10/2011 | Fischer | |
| 2013/0061969 A1 | 3/2013 | Koike | |
| 2013/0130505 A1 | 5/2013 | Diana et al. | |
| 2013/0267100 A1 * | 10/2013 | Takagi | C23C 16/405 118/724 |
| 2015/0321929 A1 | 11/2015 | Legzdins | |
| 2016/0129432 A1 | 5/2016 | Ozaki | |
| 2017/0036935 A1 | 2/2017 | Peterson | |
| 2017/0313608 A1 | 11/2017 | Peterson | |
| 2018/0001249 A1 | 1/2018 | Sher | |
| 2018/0072600 A1 | 3/2018 | Fujita | |
| 2018/0080148 A1 | 3/2018 | Westerhoff | |
| 2019/0263676 A1 | 8/2019 | Powell | |
| 2021/0230744 A1 | 7/2021 | Kimtee | |

FOREIGN PATENT DOCUMENTS

| | | |
|---|---|---|
| CN | 201404770 | 2/2010 |
| CN | 102099120 B | 6/2011 |
| CN | 202078794 | 12/2011 |
| CN | 202621032 | 12/2012 |
| CN | 102989238 B | 3/2013 |
| CN | 106621698 A | 5/2017 |
| CN | 206881336 | 1/2018 |
| CN | 206881375 U | 1/2018 |
| CN | 207605518 | 7/2018 |
| CN | 208612140 | 3/2019 |
| EP | 2366449 A2 | 9/2011 |
| EP | 2436446 B1 | 9/2016 |
| JP | S5089964 U | 7/1975 |
| JP | S52134182 U | 10/1977 |
| JP | S5371374 A | 6/1978 |
| JP | S55133209 U | 9/1980 |
| JP | 2001300259 A | 10/2001 |
| JP | 2011114067 A | 6/2011 |
| JP | 2014002127 A | 1/2014 |
| KR | 19990078633 A | 11/1999 |
| KR | 20020010955 A | 2/2002 |
| KR | 20030003833 A | 1/2003 |
| KR | 20040012390 A | 2/2004 |
| KR | 20040025749 A | 3/2004 |
| KR | 20060076372 A | 7/2006 |
| KR | 100730377 B1 | 6/2007 |
| KR | 20090054743 A | 6/2009 |
| KR | 20110079156 A | 7/2011 |
| RO | 128367 B1 | 11/2014 |
| TW | 439547 | 6/2001 |
| TW | 200532180 A | 10/2005 |
| TW | I439547 | 6/2014 |
| TW | I518830 B | 1/2016 |
| WO | 8404698 A1 | 12/1984 |
| WO | 9924365 A1 | 5/1999 |
| WO | 2005113126 A1 | 12/2005 |
| WO | 2007088940 A1 | 8/2007 |
| WO | 2018231048 A1 | 12/2018 |
| WO | 2007081519 A2 | 7/2019 |

OTHER PUBLICATIONS

USPTO; Final Office Action dated Nov. 24, 2023 in U.S. Appl. No. 17/159,488.
USPTO; Non-Final Office Action dated Feb. 28, 2024 in U.S. Appl. No. 17/159,488.
USPTO; Final Office Action dated Jul. 18, 2024 in U.S. Appl. No. 17/159,488.
USPTO; Advisory Action dated Sep. 30, 2024 in U.S. Appl. No. 17/159,488.
USPTO; Non-Final Office Action dated Oct. 28, 2024 in U.S. Appl. No. 17/159,488.

\* cited by examiner

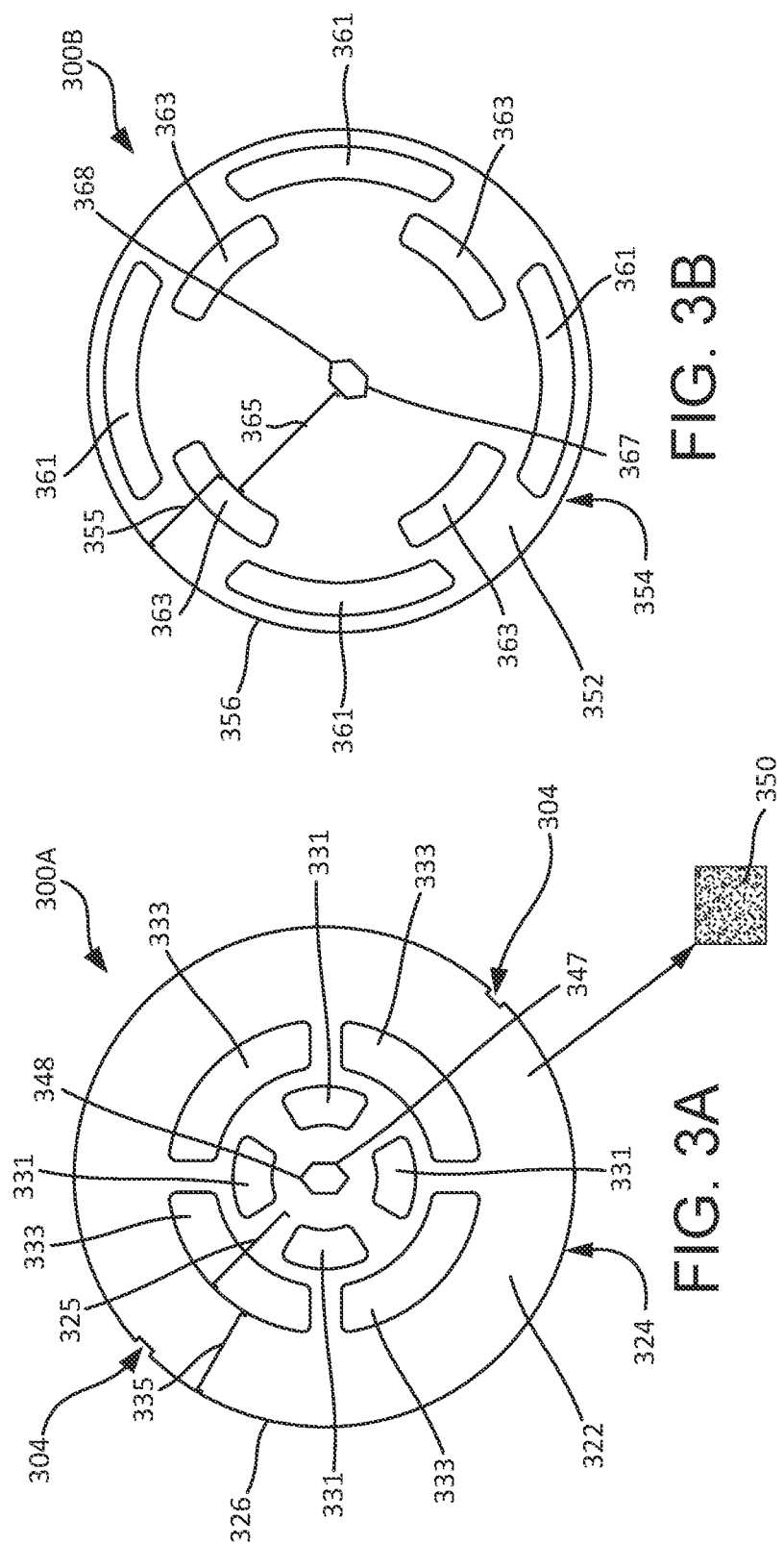

CONTAMINANT TRAP SYSTEM FOR A REACTOR SYSTEM

CROSS-REFERENCE TO RELATED APPLICATIONS

This application is a Non-provisional of, and claims priority to and the benefit of, U.S. Provisional Patent Application No. 63/194,721, filed May 28, 2021 and entitled "CONTAMINANT TRAP SYSTEM FOR A REACTOR SYSTEM," which is hereby incorporated by reference herein.

FIELD OF THE DISCLOSURE

The present disclosure relates generally to a semiconductor processing or reactor system and components comprised therein, and particularly to reactor system components that prevent contamination of other components.

BACKGROUND OF THE DISCLOSURE

Reaction chambers may be used for depositing various material layers onto semiconductor substrates. A substrate may be placed on a susceptor inside a reaction chamber. Both the substrate and the susceptor may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and other processes, these layers are made into integrated circuits.

For any given process, reactant gases and/or any byproduct gases may then be evacuated via a vacuum and/or purged from the reaction chamber. Reactant gases, and other gases or materials from the reaction chamber may be passed through a filter or a contaminant trap system, wherein the reactant gases or other materials (e.g., reaction products and/or byproducts) are trapped to prevent contamination of reactor system components downstream of the contaminant trap system. However, materials from the contaminant trap system may outgas under certain conditions, which may cause contamination of the reaction chamber or a substrate disposed therein.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

In some embodiments, a contaminant trap system for a reactor system is provided. The contaminant trap system disclosed herein may allow collection of materials from a reaction chamber of the reactor system to reduce or prevent contamination of reactor system components downstream of the contaminant trap system. The contaminant trap system disclosed herein may also reduce or prevent possible contaminants from traveling to and contaminating the reaction chamber or a substrate disposed therein.

In various embodiments, a baffle plate stack for a contaminant trap system may comprise a plurality of baffle plates, each comprising an aperture spanning through a baffle plate body of each baffle plate of the plurality of baffle plates, and a body portion; and a plurality of complementary baffle plates, each comprising a complementary aperture spanning through a complementary baffle plate body of each complementary baffle plate of the plurality of complementary baffle plates, and a complementary body portion. The plurality of baffle plates and the plurality of complementary baffle plates may be disposed in a baffle plate order between a first end and a second end of the baffle plate stack in which the plurality of baffle plates alternates with the plurality of complementary baffle plates, such that no two of the plurality of baffle plates and no two of the plurality of complementary baffle plates are adjacent in the baffle plate order. The plurality of baffle plates and the plurality of complementary baffle plates may be disposed in a baffle plate orientation wherein at least a portion of the apertures of the plurality of baffle plates and at least a portion of the complementary body portions of the plurality of complementary baffle plates may be aligned along a first axis spanning between the first end and the second end of the baffle plate stack, and such that at least a portion of the body portions of the plurality of baffle plates and at least a portion of the complementary apertures of the plurality of complementary baffle plates may be aligned along a second axis spanning between the first end and the second end of the baffle plate stack.

In various embodiments, a baffle plate stack may further comprise a coupling rod coupled to each of the plurality of baffle plates and/or each of the plurality of complementary baffle plates, wherein the coupling rod may span between the first end and the second end of the baffle plate stack, wherein the coupling rod comprises a cross-section. Each of the plurality of baffle plates may comprise a coupling hole and each of the plurality of complementary baffle plates may comprise a complementary coupling hole, wherein the coupling holes and the complementary coupling holes each may comprise a shape complementary to the cross-section of the coupling rod. In various embodiments, the cross-section of the coupling rod may be noncircular, wherein the coupling hole of each of the plurality of baffle plates may be disposed in a first orientation, and the complementary coupling hole of each of the plurality of complementary baffle plates may be disposed in a second orientation. The first orientation and the second orientation may dispose the plurality of baffle plates and the plurality of complementary baffle plates about the coupling rod to achieve the baffle plate orientation.

In various embodiments, a baffle plate stack may further comprise a plurality of spacers coupled to the coupling rod, wherein at least one of the plurality of spacers may be disposed between each baffle plate and complementary baffle plate of the plurality of baffle plates and the plurality of complementary baffle plates in the baffle plate order. In various embodiments, a baffle plate stack may further comprise an end plate disposed at least one of at the first end or the second end of the baffle plate stack, wherein the end plate may comprise an end plate aperture and an end plate body portion.

In various embodiments, there may be one more of the plurality of baffle plates than the plurality of complementary baffle plates, such that baffle plate stack may comprise the same order of the plurality of baffle plates and the plurality of complementary baffle plates from the first end and the second end of the baffle plate stack. In various embodiments, at least one of the plurality of baffle plates and the plurality of complementary baffle plates may comprise a textured surface.

In various embodiments, a contaminant trap system of a reactor system may comprise a trap housing comprising a housing outer wall; a first baffle plate disposed in the trap housing, wherein the first baffle plate may comprise a first aperture spanning through a first baffle plate body between a first top baffle plate surface and a first bottom baffle plate surface of the first baffle plate, and a first body portion; a first complementary baffle plate disposed in the trap housing in series with the first baffle plate between a first end and a second end of the trap housing, wherein the first complementary baffle plate may comprise a first complementary aperture spanning through a first complementary baffle plate body between a first top complementary baffle plate surface and a first bottom complementary baffle plate surface of the first complementary baffle plate, and a first complementary body portion. The first baffle plate and the first complementary baffle plate may be comprised in a baffle plate stack. The first baffle plate and the first complementary baffle plate may be disposed in a baffle plate orientation in the trap housing wherein at least a portion of the first aperture of the first baffle plate and at least a portion of the first complementary body portion of the first complementary baffle plate may be aligned along a first axis spanning between the first end and the second end of the trap housing, and such that at least a portion of the first body portion of the first baffle plate and at least a portion of the first complementary aperture of the first complementary baffle plate may be aligned along a second axis spanning between the first end and the second end of the trap housing. In various embodiments, the first aperture of the first baffle plate may be comprised in a radially inward portion of the first baffle plate, and/or the first complementary aperture of the first complementary baffle plate may be comprised in a radially outward portion of the first complementary baffle plate. In various embodiments, the contaminant trap system may further comprise a heater jacket coupled to the trap housing.

In various embodiments, the contaminant trap system may further comprise a coupling rod disposed in the trap housing and spanning between the first end and the second end of the trap housing. The first baffle plate may comprise a first coupling hole disposed through the first baffle plate body, wherein the coupling rod may be disposed through the first coupling hole. The first complementary baffle plate may comprise a first complementary coupling hole disposed through the first complementary baffle plate body, wherein the coupling rod may be disposed through the first complementary coupling hole. In various embodiments, the coupling rod may comprise a noncircular cross-section, wherein the first coupling hole of the first baffle plate and the first complementary coupling hole of the first complementary baffle plate each may comprise a shape complementary to the noncircular cross-section of the coupling rod. In various embodiments, a reference point of the first coupling hole may be disposed in a first orientation, and a complementary reference point of the first complementary coupling hole may be disposed in a first complementary orientation, wherein the first orientation and the first complementary orientation may dispose the first baffle plate and the first complementary baffle plate about the coupling rod to achieve the baffle plate orientation.

In various embodiments, the contaminant trap system may further comprise a spacer between the first baffle plate and the first complementary baffle plate to provide a space therebetween.

In various embodiments, the contaminant trap system may further comprise a second baffle plate disposed in the trap housing, wherein the second baffle plate may comprise a second aperture spanning through a second baffle plate body between a second top baffle plate surface and a second bottom baffle plate surface of the second baffle plate, and a second body portion. The second baffle plate may be disposed in the trap housing such that the first complementary baffle plate may be between the first baffle plate and the second baffle plate, and wherein the baffle plate orientation may further comprise at least a portion of the second aperture of the second baffle plate and at least a portion of the first complementary body portion of the first complementary baffle plate being aligned along the first axis, and such that at least a portion of the second body portion of the second baffle plate and at least a portion of the first complementary aperture of the first complementary baffle plate may be aligned along the second axis. In various embodiments, the first baffle plate and the second baffle plate may comprise an identical design.

In various embodiments, the baffle plate stack may further comprise an end plate disposed such that the first baffle plate is between the end plate and the first complementary baffle plate, or the first complementary baffle plate is between the end plate and the first baffle plate. The end plate may comprise an end plate aperture and an end plate body portion.

In various embodiments, the housing outer wall of the trap housing may comprise an interior wall surface. An outer edge of at least one of the first baffle plate and the first complementary baffle plate may be disposed adjacent to the interior wall surface such that at least a partial seal may be formed between the outer edge of the first baffle plate and/or the first complementary baffle plate, and the interior wall surface.

In various embodiments, the first top baffle plate surface, the first bottom baffle plate surface, the first top complementary baffle plate surface, the first bottom complementary baffle plate surface, the outer edge of at least one of the first baffle plate and the first complementary baffle plate, and/or the interior wall surface is textured.

In various embodiments, a method may comprise flowing a fluid from a reaction chamber into a trap housing of a contaminant trap system; flowing the fluid through a baffle plate stack disposed in the trap housing and comprising a plurality of baffle plates and a plurality of complementary baffle plates; flowing the fluid through an aperture of a first baffle plate of the plurality of baffle plates; flowing the fluid into the complementary body portion of a first complementary baffle plate of the plurality of complementary baffle plates in response to the flowing the fluid through the aperture of the first baffle plate; depositing contaminants onto the complementary body portion of the first complementary baffle plate in response to the flowing the fluid into the complementary body portion of the first complementary baffle plate; flowing the fluid through a complementary aperture of the first complementary baffle plate in response to the flowing the fluid into the complementary body portion of the first complementary baffle plate; flowing the fluid into the body portion of a second baffle plate of the plurality of baffle plates in response to the flowing the fluid through the complementary aperture of the first complementary baffle plate; and/or depositing contaminants onto the body portion of the second baffle plate in response to the flowing the fluid into the body portion of the second baffle plate. Each of the plurality of baffle plates may comprise a body portion and an aperture spanning through a baffle plate body of each baffle plate of the plurality of baffle plates. Each of the plurality of complementary baffle plates may comprise a complementary body portion and a complementary aperture spanning through a complementary baffle plate body of each complementary baffle plate of the plurality of complementary baffle plates. The plurality of baffle plates and the plurality of complementary baffle plates may be disposed in a baffle plate order between a first end and a second end of the baffle plate stack in which the plurality of baffle plates may alternate with the plurality of complementary baffle plates, such that no two of the plurality of baffle plates and no two of the plurality of complementary baffle plates are adjacent in the baffle plate order. The plurality of baffle plates and the plurality of complementary baffle plates may be disposed in a baffle plate orientation wherein at least a portion of the apertures of the plurality of baffle plates and at least a portion of the complementary body portions of the plurality of complementary baffle plates may be aligned along a first axis spanning between the first end and the second end of the baffle plate stack, and such that at least a portion of the body portions of the plurality of baffle plates and at least a portion of the complementary apertures of the plurality of complementary baffle plates may be aligned along a second axis spanning between the first end and the second end of the baffle plate stack.

In various embodiments, a baffle plate stack for a contaminant trap system may comprise a plurality of baffle plates disposed in a baffle plate order between a first end and a second end of the baffle plate stack. Each baffle plate of the plurality of baffle plates may comprise an aperture and a body portion. Each of the plurality of baffle plates may be disposed in a baffle plate orientation such that at least a portion of an aperture of a first baffle plate of the plurality of baffle plates and at least a portion of a body portion of a second baffle plate of the plurality of baffle plates may be aligned along a first axis spanning between the first end and the second end of the baffle plate stack, and wherein at least one baffle plate of the plurality of baffle plates comprises a sintered material.

In various embodiments, a contaminant trap system of a reactor system may comprise a trap housing; and a trap structure disposed in the trap housing. The trap structure may comprise a baffle plate; a base plate; and a plurality of rods spanning between and coupled to the baffle plate and the base plate. The rods may be disposed about a flow hole disposed through the base plate.

In various embodiments, a contaminant trap system of a reactor system may comprise a trap housing comprising a housing bottom surface and a housing top surface; and a trap structure disposed in the trap housing. The trap structure may comprise a plurality of tubes disposed in an arrangement having an outer shape complementary to a shape of the trap housing; a support disposed within the arrangement of the plurality of tubes and protruding outwardly from an end of the plurality of tubes, wherein the support contacts the housing bottom surface, creating a space between the end of the plurality of tubes and the housing bottom surface; and a tensioning device coupled around the plurality of tubes configured to hold the plurality of tubes together. The plurality of tubes may be packed hexagonally, wherein each tube of the plurality of tubes comprises a bore and may span at least partially between the housing bottom surface and the housing top surface.

In various embodiments, a contaminant trap of a reactor system may comprise a trap housing; and a trap structure disposed in the trap housing. The trap structure may comprise a corrugated sheet coupled to a noncorrugated sheet. The corrugated and noncorrugated sheets may be spiraled such that portions of the corrugated sheet are disposed between portions of the noncorrugated sheet, and such that portions of the noncorrugated sheet are disposed between portions of the corrugated sheet.

In various embodiments, the trap structure comprised in a contaminant trap system (e.g., one or more baffle plates, complementary baffle plates, rods, tubes, corrugated sheets, or the like) may comprise, or be at least partially comprised of, a sintered material. In various embodiments, the sintered material may comprise at least one of a metal material (e.g., a metal or metal alloy) or a ceramic material.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

FIG. 3A illustrates an exemplary baffle plate, in accordance with various embodiments;

FIG. 3B illustrates an exemplary complementary baffle plate, in accordance with various embodiments;

DETAILED DESCRIPTION

Figure 1:
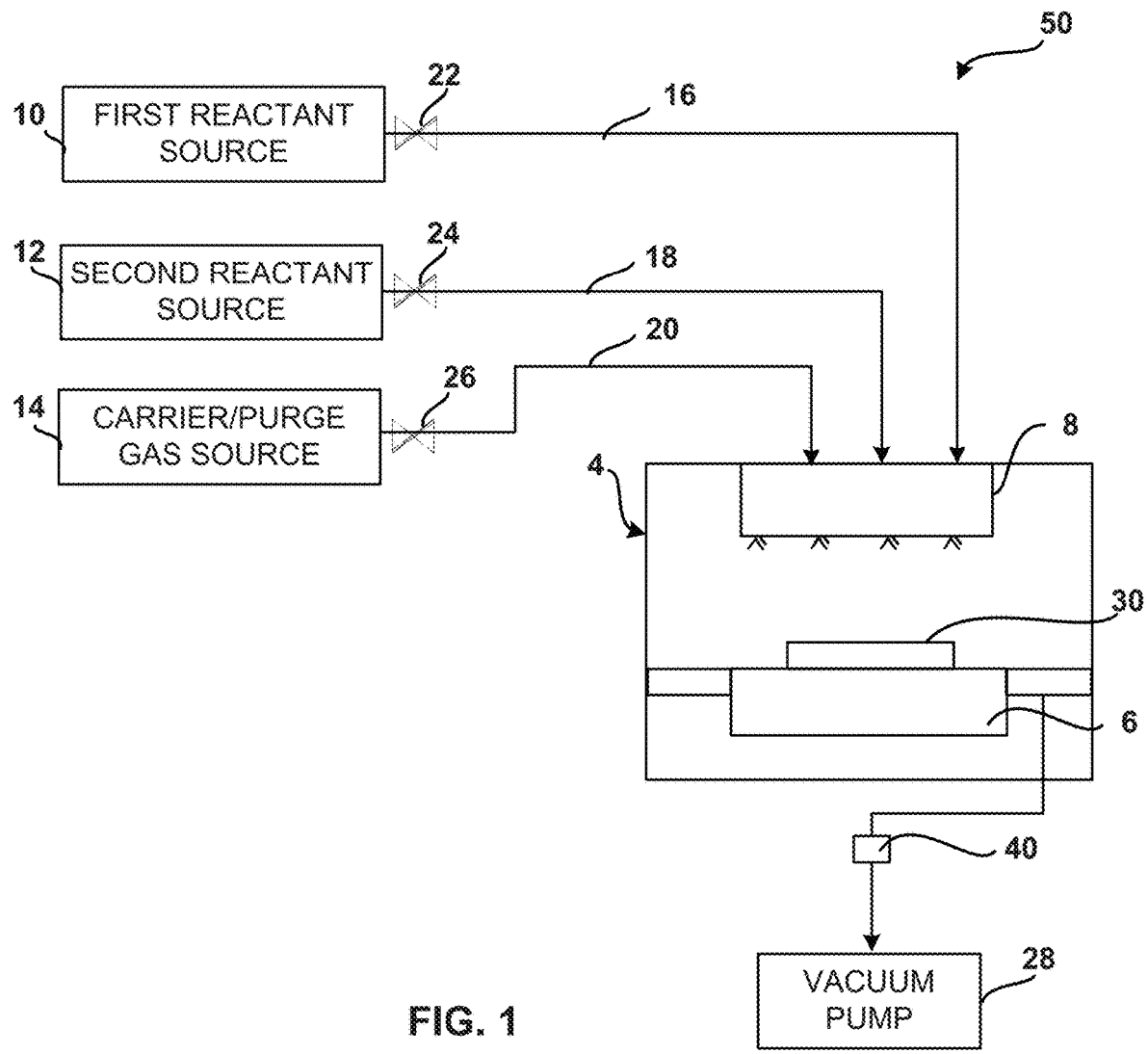
FIG. 1 illustrates a schematic diagram of an exemplary reactor system, in accordance with various embodiments.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate disposed in the reaction chamber, or any unwanted material in any component of a reaction system. The term "contaminant" may refer to, but is not limited to, unwanted deposits, metal and non-metal particles, impurities, and waste products, disposed within the reaction chamber or other components of the reactor system.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Reactor systems used for ALD, CVD, and/or the like, may be used for a variety of applications, including depositing and etching materials on a substrate surface. In various embodiments, a reactor system 50 may comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20, and valves or controllers 22-26. Reactant gases or other materials from reactant sources 10, 12 may be applied to substrate 30 in reaction chamber 4. A purge gas from purge gas source 14 may be flowed to and through reaction chamber 4 to remove any excess reactant or other undesired materials from reaction chamber 4. System 50 may also comprise a vacuum source 28 fluidly coupled to the reaction chamber 4, which may be configured to suck reactants, a purge gas, or other materials out of reaction chamber 4. System 50 may comprise a contaminant trap system 40 disposed between reaction chamber 4 and vacuum source 28 to trap (i.e., accumulate) materials (e.g., contaminants) coming from reaction chamber 4, reducing or preventing contamination of reactor system 50 components downstream of contaminant trap system 40.

Figure 2:
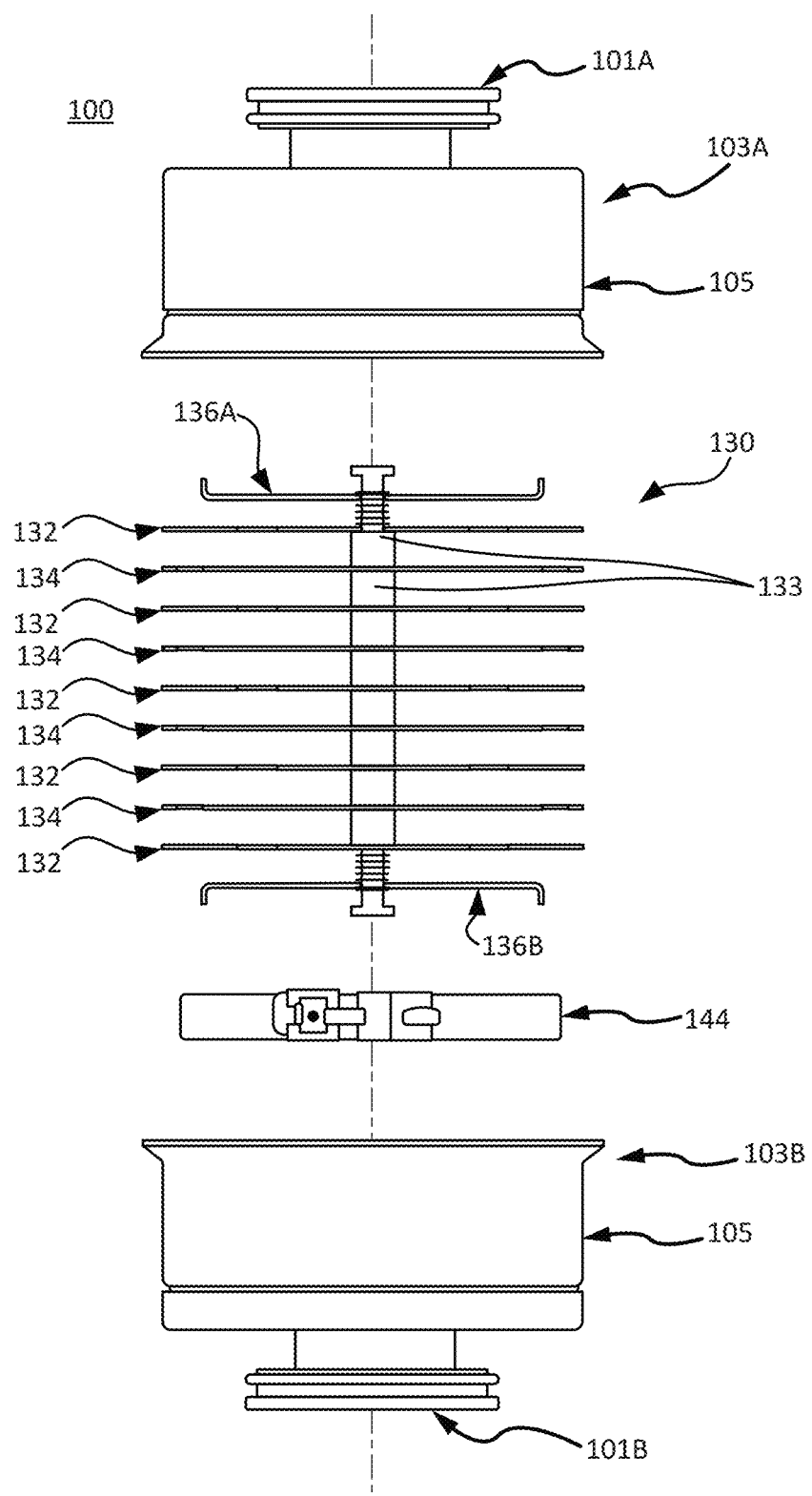
FIG. 2 illustrates an exploded view of an exemplary contaminant trap system, in accordance with various embodiments.

With reference to FIG. 2, a contaminant trap system 100 (an exploded view thereof) is illustrated (an example of contaminant trap system 40 in FIG. 1), in accordance with various embodiments. In various embodiments, contaminant trap system 100 may comprise a trap housing 103, which may comprise multiple components (e.g., upper housing 103A and lower housing 103B). In various embodiments, upper housing 103A and lower housing 103B may couple to enclose other components of contaminant trap system 100. Upper housing 103A may comprise a fluid inlet 101A, through which the interior of trap housing 103 may be fluidly coupled to a reaction chamber (e.g., reaction chamber 4). Gases and other material may flow from the reaction chamber into contaminant trap system 100 through fluid inlet 101A, and may exit contaminant trap system 100 through fluid outlet 101B.

In various embodiments, trap housing 103 may comprise an outer wall 105 comprising an interior wall surface. The interior wall surface may define the internal space enclosed within trap housing 103 (e.g., when upper housing 103A and lower housing 103B are coupled). The internal space of trap housing 103 may be in fluid communication with fluid inlet 101A and fluid outlet 101B.

In various embodiments, contaminant trap system 100 may comprise a trap structure (e.g., housed within the trap housing) configured to trap contaminants traveling therethrough. The contaminants may deposit on the surfaces of the trap structure as fluid travels through the trap system. In various embodiments, the trap structure may comprise a baffle plate stack (e.g., baffle plate stack 130). Baffle plate stack 130 may comprise at least two plates, which may cause fluid flow entering the internal space of trap housing 103 to take a certain path (e.g., a path that will increase or maximize fluid flow through the internal space of trap housing 103, and/or allow increased or maximum removal of contaminants from the fluid flow by the contaminant trap system and its components). The fluid flow path through the internal space of trap housing 103 may increase the fluid path to increase contact with the components of contaminant trap system 100 (e.g., the surfaces of the baffle plates in trap housing 103), therefore, allowing more opportunities for contaminant deposition on such surfaces as the fluid flows through contaminant trap system 100.

In various embodiments, baffle plate stack 130 may comprise at least one baffle plate 132 and at least one complementary baffle plate 134. Each baffle plate 132 may have substantially the same design (e.g., comprising apertures therethrough), and each complementary baffle plate 134 may have substantially the same design (e.g., comprising complementary apertures therethrough). Baffle plates 132 and complementary baffle plates 134 may be disposed in a baffle plate order in baffle plate stack 130 between a first end of trap housing 103 (proximate fluid inlet 101A) and a second end of trap housing 103 (proximate fluid outlet 101B). A first end of baffle plate stack 130 may be proximate the first end of trap housing 103, and a second end of baffle plate stack 130 may be proximate the second end of trap housing 103. The baffle plate order may comprise baffle plates 132 alternating positions with complementary baffle plates 134, such that no two baffle plates 132, and no two complementary baffle plates 134, are adjacent in the baffle plate order.

Baffle plate stack 130 may comprise any suitable number of baffle plates of any design, order, and/or composition. For example, in various embodiments, baffle plate stack 130 may comprise all of one type of baffle plate (e.g., all of baffle plates 132 or all of complementary baffle plates 134). In various embodiments, baffle plate stack 130 may comprise any suitable mixture of baffle plate designs. For example, baffle plate stack 130 may comprise baffle plates comprising two or more designs. As a further example, baffle plate stack 130 may comprise a first number of baffle plates 132 and a second number of complementary baffle plates 134. In various embodiments, baffle plate stack 130 may comprise an equal number of baffle plates 132 and complementary baffle plates 134 (e.g., alternating in the baffle plate order between the first and second ends of baffle plate stack 130). In various embodiments, baffle plate stack 130 may comprise one more baffle plate 132 than complementary baffle plates 134, such that the baffle plate order starts and ends with a baffle plate 132 (i.e., a baffle plate 132 is the baffle plate most proximate the first and second ends of trap housing 103).

In various embodiments, the baffle plate stack may comprise at least one end plate coupled to each end of the baffle plate stack. For example, a first end plate 136A may be comprised in baffle plate stack 130 as the end plate on a first end of baffle plate stack 130, and a second end plate 136B may be comprised in baffle plate stack 130 as the end plate on a second end of baffle plate stack 130. The first end of baffle plate stack 130 may be disposed in the internal space of trap housing 103 proximate the first end of trap housing 103, and the second end of baffle plate stack 130 may be disposed in the internal space of trap housing 103 proximate the second end of trap housing 103. The end plate(s) comprised in a baffle plate stack may comprise any suitable design, including a design different than the baffle plates and/or complementary baffle plates comprised in the baffle plate stack.

The arrangement of the baffle plates in baffle plate stack 130 may comprise any suitable arrangement, including any suitable spacing arrangement. The baffle plates may each be separated by a spacer 133. That is, a spacer 133 may be disposed between every two plates in the baffle plate stack. The plates in the baffle plate stack may be spaced apart by any suitable distance, for example, to accomplish a desired pressure drop of the fluid flow through trap housing 103. To decrease the amount of pressure drop through trap housing 103, there may be fewer baffle plates in the baffle plate stack, and/or more space between the baffle plates. Conversely, to increase the amount of pressure drop through trap housing 103, there may be more baffle plates in the baffle plate stack, and/or less space between the baffle plates.

Each baffle plate (e.g., baffle plates 132 and complementary baffle plates 134 in baffle plate stack 130) may comprise a shape that is complementary to the internal space of trap housing 103 such that baffle plate stack 130 and the baffle plates comprised therein may be disposed in the internal space of trap housing 103. In various embodiments, an outer edge of one or more plates comprised in the baffle plate stack disposed in the internal space of trap housing 103 may be disposed adjacent to and/or in contact with the interior wall of trap housing 103. The outer edge of one or more of the plates may form at least a partial seal between the respective baffle plate and the interior wall of trap housing 103. Therefore, a limited amount of fluid flow (or no fluid flow) may pass between the outer edges of the plates in a baffle plate stack and the interior wall of trap housing 103.

Figure 4A:
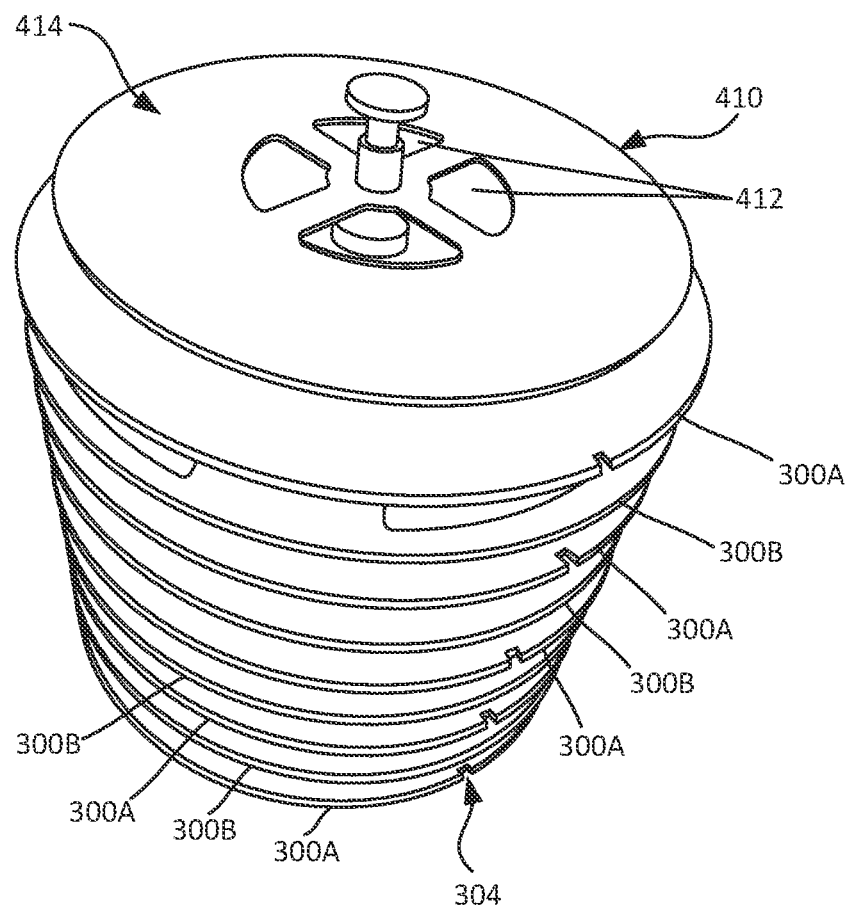
FIG. 4A illustrates a perspective view of an exemplary filter baffle plate stack of a contaminant trap system, in accordance with various embodiments.

With reference to FIGS. 3A, 3B and 4A, in various embodiments, a baffle plate (e.g., baffle plate 300A, which is an example of baffle plate 132 in FIG. 2) may comprise a top surface 322, a bottom surface 324, a baffle plate body therebetween, and a baffle plate outer edge 326. A baffle plate may comprise at least one aperture disposed through the baffle plate body between top surface 322 and bottom surface 324 and defined by an aperture edge. For example, baffle plate 300A may comprise first apertures 331 and second apertures 333. The apertures comprised in a baffle plate may be in any suitable aperture arrangement, such as the aperture arrangement of baffle plate 300A shown in FIG. 3A. As an example of an aperture arrangement of a baffle plate, the apertures may be spaced equidistant from other like apertures about a center of the baffle plate shape (e.g., the center of a circle). In various embodiments, the apertures of a baffle plate may be comprised in an aperture portion of the baffle plate. For example, aperture portion 325 of baffle plate 300A may be disposed on a radially-inward portion of the baffle plate, wherein the radially-outward portion of baffle plate 300A may not comprise an aperture. The portion of a baffle plate without an aperture may be a body portion (e.g., body portion 335 of baffle plate 300A).

With continued reference to FIGS. 3A, 3B and 4A, in various embodiments, a complementary baffle plate (e.g., complementary baffle plate 300B, which is an example of complementary baffle plate 134 in FIG. 2) may comprise a complementary top surface 352, a complementary bottom surface 354, a complementary baffle plate body therebetween, and a complementary baffle plate outer edge 356. A complementary baffle plate may comprise at least one complementary aperture disposed through the complementary baffle plate body between complementary baffle plate top surface 352 and bottom surface 354 and defined by a complementary aperture edge. For example, complementary baffle plate 300B may comprise first complementary apertures 361 and second complementary apertures 363. The complementary apertures comprised in a complementary baffle plate may be in any suitable complementary aperture arrangement, such as the complementary aperture arrangement of complementary baffle plate 300B shown in FIG. 3B. As an example of a complementary aperture arrangement of a complementary baffle plate, the complementary apertures may be spaced equidistant from other like complementary apertures about a center of the complementary baffle plate shape (e.g., the center of a circle). In various embodiments, the complementary apertures of a complementary baffle plate may be comprised in a complementary aperture portion of the complementary baffle plate. For example, aperture portion 355 of complementary baffle plate 300B may be disposed on a radially-outward portion of the complementary baffle plate, wherein the radially-inward portion of complementary baffle plate 300B may not comprise a complementary aperture. The portion of a complementary baffle plate without a complementary aperture may be a complementary body portion (e.g., complementary body portion 365 of complementary baffle plate 300B).

Complementary baffle plates (e.g., complementary baffle plates 300B) may be complementary to baffle plates (e.g., baffle plates 300A) because complementary baffle plates may comprise complementary apertures in portions of the plate which the baffles plates do not comprise apertures. As an example, discussed above, complementary baffle plates 300B comprise complementary apertures 361 and 363 in a radially outward portion thereof, while baffle plates 300A do not comprise apertures in a radially outward portion thereof.

In various embodiments, a baffle plate stack may comprise a coupling rod to which baffle plates and/or complementary baffle plates may couple. For example, baffle plate stack 400B in FIG. 4B may comprise coupling rod 450. The coupling rod may comprise any suitable shape, length, and/or cross-sectional shape. In various embodiments, the coupling rod may be configured to span between the first and second ends of trap housing 103. The coupling rod may be configured to engage and/or couple with other components of a baffle plate stack, such as baffle plates, complementary baffle plates, end plates, spacers, and/or the like. In various embodiments, at least a portion of a coupling rod may comprise threading, such as one or more of the ends of coupling rod 450 to engage with a fastener to secure the baffle plates, complementary baffle plates, end plates, and/or spacers together.

Figure 4B:
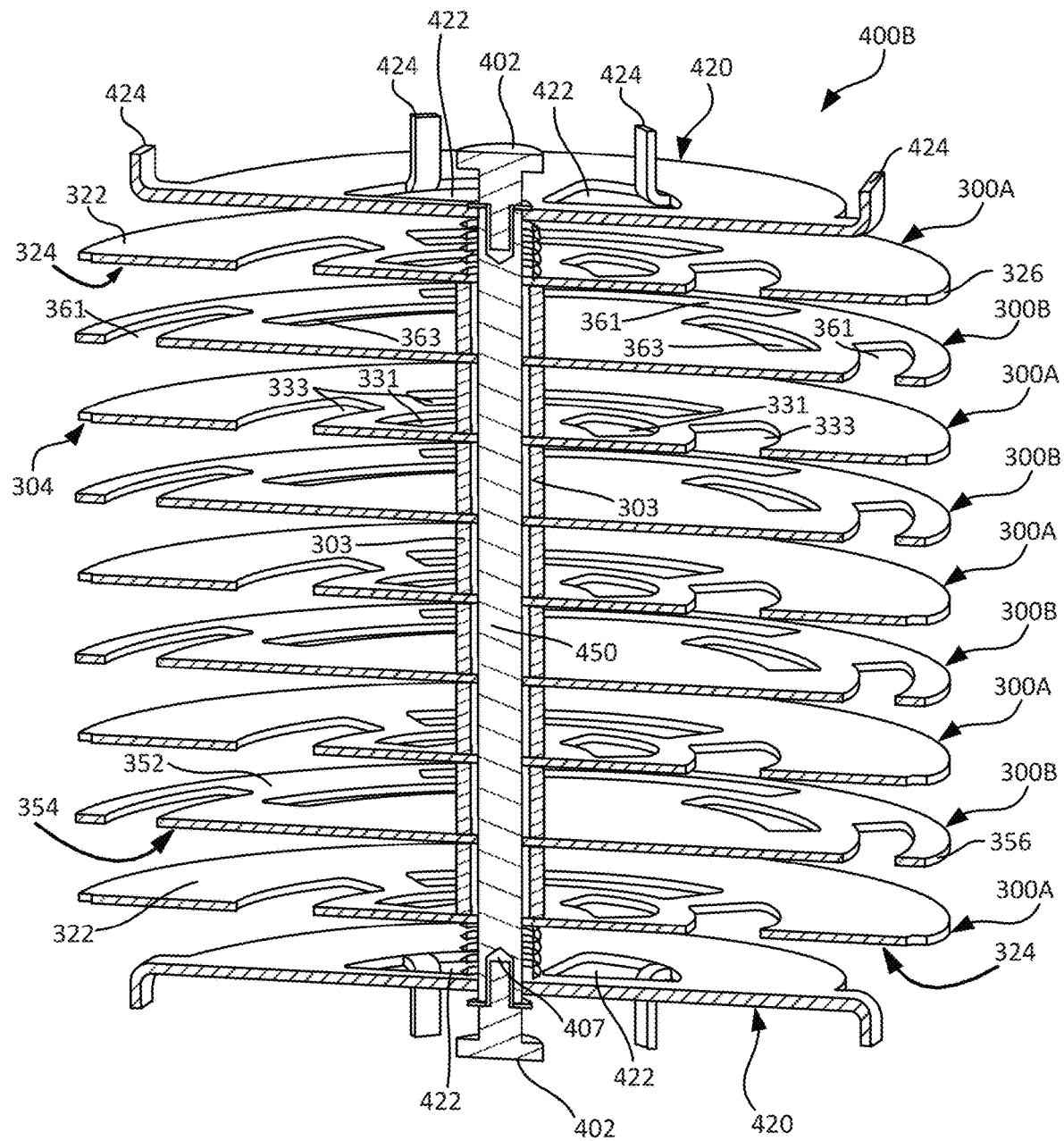
FIG. 4B illustrates a cross-sectional perspective view of an exemplary filter baffle plate stack of a contaminant trap system, in accordance with various embodiments.

For space and clarity purposes, the reference numbers and lead lines for specific baffle plate components and complementary baffle plate components in FIGS. 4A and 4B are included in one or more exemplary baffle plates or complementary baffle plates illustrated therein. However, such labeled components may apply to each similarly labeled baffle plate or complementary baffle plate, as appropriate.

In various embodiments, each baffle plate may comprise a coupling hole configured to receive and/or engage with the coupling rod. For example, baffle plate 300A may comprise a coupling hole 347 having a shape that is complementary to a cross-sectional shape of coupling rod 450. Therefore, coupling rod 450 may be inserted through coupling hole 347, and coupling hole 347 may engage with coupling rod 450.

In various embodiments, the coupling hole of a baffle plate may comprise a non-circular shape, such that the coupling rod may engage with the coupling hole and maintain the baffle plate a desired position (e.g., so baffle plate 300A does not rotate about coupling rod 450 within trap housing 103). In various embodiments, the coupling hole of a baffle plate may comprise a shape that is symmetrical about only one line passing through the coupling hole (e.g., through a center of the coupling hole). That way, the coupling hole may only engage with the coupling rod in a way that disposes the baffle plate in a desired orientation (a self-aligning feature). In various embodiments, to aid in disposing a baffle plate in a desired orientation about the coupling rod, the coupling hole may comprise a reference point which is disposed in a specific orientation or at a specific angle, and/or a specific position relative to the aperture(s) of the baffle plate. For example, coupling hole 347 may comprise reference point 348 which may be oriented at a specific angle (e.g., such that reference point 348 is aligned with a first aperture 331 and/or between two second apertures 333).

In various embodiments, each complementary baffle plate may comprise a complementary coupling hole configured to receive and/or engage with the coupling rod. For example, complementary baffle plate 300B may comprise a complementary coupling hole 367 having a complementary shape that is complementary to a cross-sectional shape of coupling rod 450. Therefore, that coupling rod 450 may be inserted through complementary coupling hole 367, and complementary coupling hole 367 may engage with coupling rod 450.

In various embodiments, the complementary coupling hole of a complementary baffle plate may comprise a non-circular shape, such that the coupling rod may engage with the complementary coupling hole and maintain the complementary baffle plate in a desired position (e.g., so complementary baffle plate 300B does not rotate about coupling rod 450 within trap housing 103). In various embodiments, the complementary coupling hole of a complementary baffle plate may comprise a complementary shape that is symmetrical about only one line passing through the coupling hole (e.g., through a center of the complementary coupling hole). That way, the complementary coupling hole may only engage with the coupling rod in a way that disposes the complementary baffle plate in a desired orientation (a self-aligning feature). In various embodiments, to aid in disposing a complementary baffle plate in a desired orientation about the coupling rod, the complementary coupling hole may comprise a complementary reference point which is oriented in a specific complementary angle, and/or a specific position relative to the complementary aperture(s) of the complementary baffle plate. For example, complementary coupling hole 367 may comprise complementary reference point 368 which may be oriented at a specific complementary angle (e.g., such that complementary reference point 368 is aligned with a complementary second aperture 363 and/or between two complementary first apertures 361).

In various embodiments, the reference point of a coupling hole and the complementary reference point of a complementary coupling hole may dispose the baffle plate and the complementary baffle plate in an orientation such that an aperture of a baffle plate may be aligned along an axis with a complementary body portion (or radially proximate to space between complementary apertures) of an adjacent complementary baffle plate in the baffle plate order, wherein the axis spans along the baffle plate order. In various embodiments, the reference and the complementary reference point of a complementary coupling hole may dispose the baffle plate and the complementary baffle plate in an orientation such that a complementary aperture of a complementary baffle plate may be aligned along an axis with a body portion (or radially proximate a space between apertures) of an adjacent baffle plate in the baffle plate order, wherein the axis spans along the baffle plate order. For example, coupling hole 347 and reference point 348 may dispose baffle plate 300A, and complementary coupling hole 367 and complementary reference point 368 may dispose complementary baffle plate 300B, such that apertures 333 are aligned along an axis with space between complementary apertures 363, and such that complementary apertures 363 are aligned along an axis with space between apertures 333.

In various embodiments, the baffle plates and complementary baffle plates may be disposed in a certain baffle plate orientation to achieve desired fluid flow therethrough and contamination deposition thereon during contaminant trap system 100 operation. In various embodiments, the rotational position of the baffle plates and complementary baffle plates about a coupling rod in a baffle plate stack may be offset relative to one another (e.g., by the orientation of the coupling hole and reference point, and the orientation of the complementary coupling hole and complementary reference point) such that the apertures of a baffle plate are not in series and/or aligned with the complementary apertures of a complementary baffle plate along an axis spanning the baffle plate stack. Further, the apertures of a baffle plate may be in series and/or aligned with, along an axis spanning a baffle plate stack, at least a portion of the complementary body portion (or portions of the complementary baffle plate body, e.g., between complementary apertures) of an adjacent complementary baffle plate in the baffle plate stack. Further, the complementary apertures of a complementary baffle plate may be in series and/or aligned with, along an axis spanning a baffle plate stack, at least a portion of the body portion (or portions of the baffle plate body, e.g., between apertures) of an adjacent baffle plate in the baffle plate stack. In other words, in various embodiments, the reference point of a coupling hole may be aligned with an aperture of the baffle plate, and the complementary reference point of a complementary coupling hole may be aligned with a complementary body portion or a space between the complementary apertures of a complementary baffle plate; and/or, the reference point of a coupling hole may be aligned with a body portion or space between the apertures of a baffle plate, and the complementary reference point of a complementary coupling hole may be aligned with a complementary aperture of a complementary aperture of a complementary baffle plate. For example, reference point 348 may be aligned with an aperture of baffle plate 300A, and complementary reference point 368 may be aligned with a complementary body portion 365 of complementary baffle plate 300B. Accordingly, apertures 331 and 333 of baffle plate 300A may be in series and/or aligned with complementary body portion 365 and/or spaces between complementary apertures 361 and/or 363 of complementary baffle plate 300B, and complementary apertures 361 and/or 363 of complementary baffle plate 300B may be in series and/or aligned with body portion 335 and/or spaces between apertures 331 and/or 333 of baffle plate 300A.

Figure 5B:
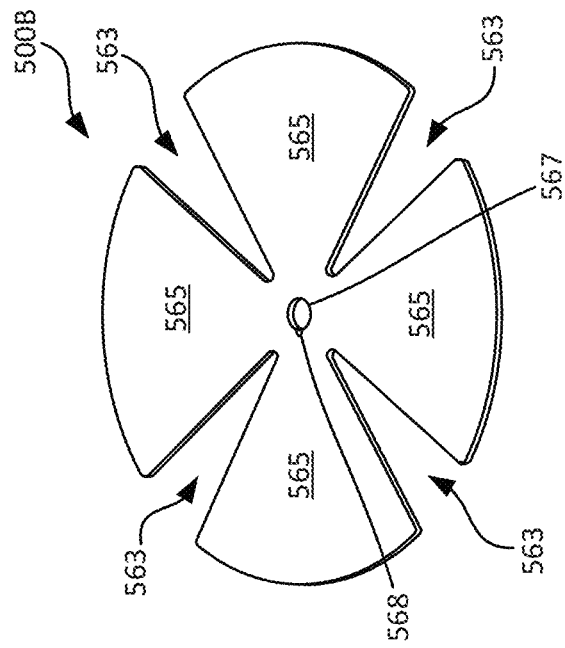
FIG. 5B illustrates another exemplary complementary baffle plate, in accordance with various embodiments.
Figure 5A:
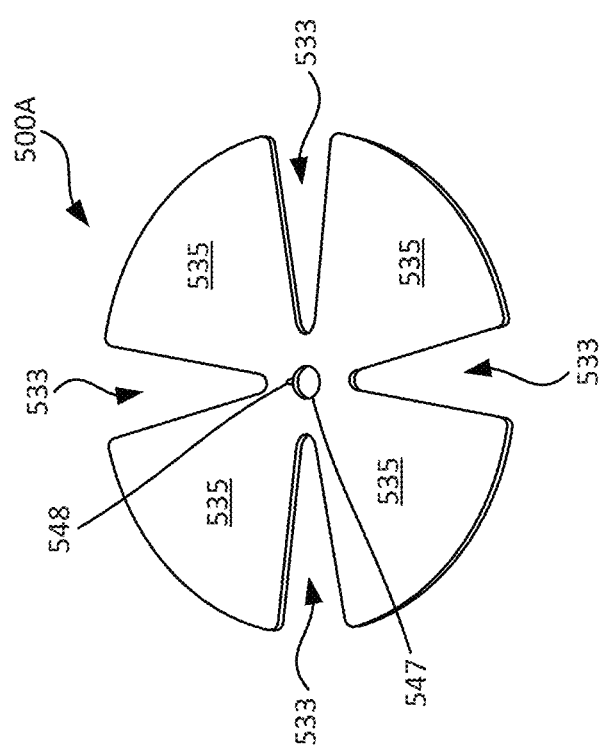
FIG. 5A illustrates another exemplary baffle plate, in accordance with various embodiments.

FIGS. 5A and 5B depict, in accordance with additional embodiments, a baffle plate 500A and a complementary baffle plate 500B. Baffle plate 500A may comprise apertures 533 and body portions 535. Baffle plate 500A may further comprise coupling hole 547 having a reference point 548. Reference point 548 may be oriented toward an aperture 533. Apertures 533 may be equidistant about center of baffle plate 500A.

Complementary baffle plate 500B may comprise complementary apertures 563 and complementary body portions 565. Complementary baffle plate 500B may further comprise complementary coupling hole 567 having a complementary reference point 568. Complementary reference point 568 may be oriented toward a complementary body portion 565. Complementary body portions 565 may be equidistant about center of complementary baffle plate 500B.

The coupling rod to which baffle plate 500A and complementary baffle plate 500B may couple may comprise a cross-sectional shape complementary to coupling hole 547 and complementary coupling hole 567. That is, the coupling rod may comprise a body and a protrusion complementary to reference point 548 and complementary reference point 568. The shape and orientation of coupling hole 547 and complementary coupling hole 567, and reference point 548 and complementary reference point 568, respectively, may offset the rotational position of the baffle plates and complementary baffle plates about a coupling rod in a baffle plate stack relative to one another. Accordingly, apertures 533 of baffle plate 500A may be in series and/or aligned with, along an axis spanning a baffle plate stack, complementary body portions 565 and/or spaces between complementary apertures 563 of complementary baffle plate 500B, and complementary apertures 563 of complementary baffle plate 500B may be in series and/or aligned with, along an axis spanning a baffle plate stack, body portion 535 and/or spaces between apertures 533 of baffle plate 500A.

Figure 6B:
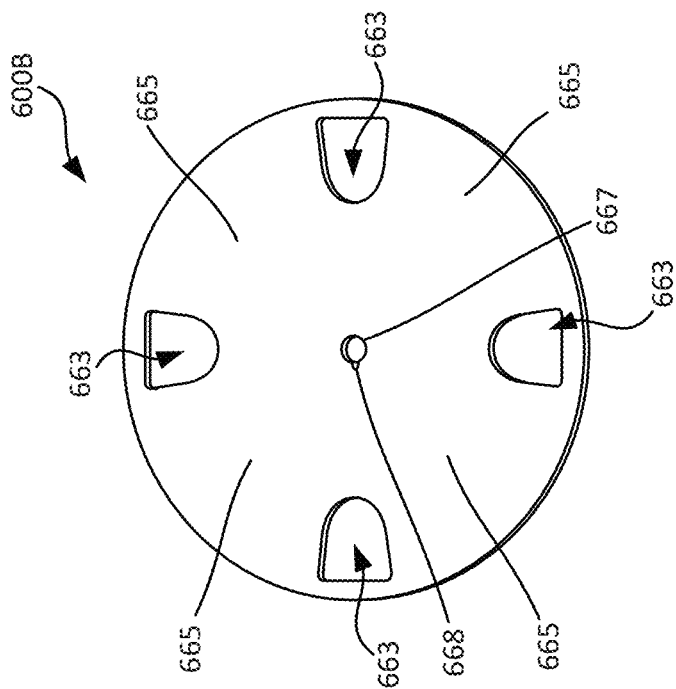
FIG. 6B illustrates yet another exemplary complementary baffle plate, in accordance with various embodiments.
Figure 6A:
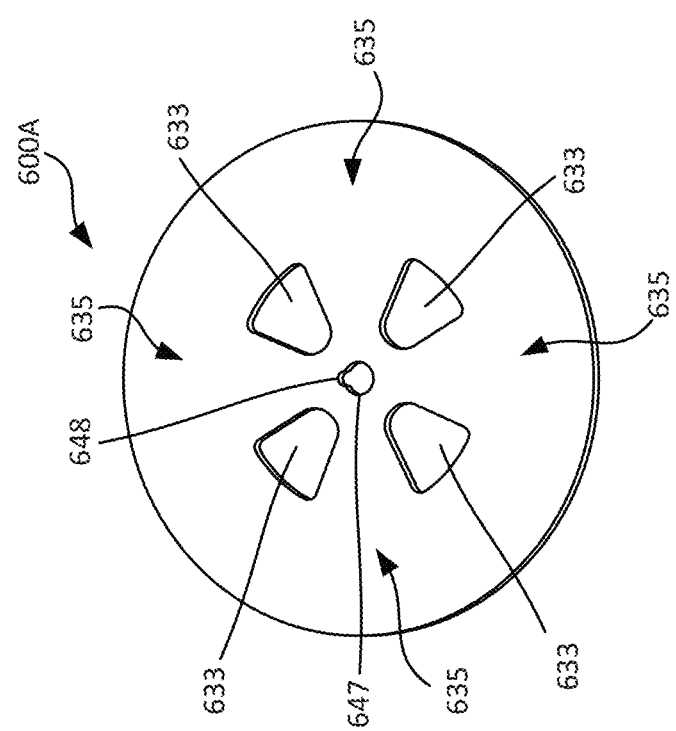
FIG. 6A illustrates yet another exemplary baffle plate, in accordance with various embodiments.

FIGS. 6A and 6B depict, in accordance with further embodiments, a baffle plate 600A and a complementary baffle plate 600B. Baffle plate 600A may comprise apertures 633 and body portions 635. Baffle plate 600A may further comprise coupling hole 647 having a reference point 648. Reference point 648 may be oriented toward a body portion 635 and/or space between apertures 633. Apertures 633 may be equidistant about center of baffle plate 600A.

Complementary baffle plate 600B may comprise complementary apertures 663 and complementary body portions 665. Complementary baffle plate 600B may further comprise complementary coupling hole 667 having a complementary reference point 668. Complementary reference point 668 may be oriented toward a complementary aperture 663. Complementary apertures 663 may be equidistant about center of complementary baffle plate 600B.

The coupling rod to which baffle plate 600A and complementary baffle plate 600B may couple may comprise a cross-sectional shape complementary to coupling hole 647 and complementary coupling hole 667. That is, the coupling rod may comprise a body and a protrusion complementary to reference point 648 and complementary reference point 668. The shape and orientation of coupling hole 647 and complementary coupling hole 667, and reference point 648 and complementary reference point 668, respectively, may offset the rotational position of the baffle plates and complementary baffle plates about a coupling rod in a baffle plate stack relative to one another. Reference point 648 may be aligned with a body portion 635, and/or space between apertures 633, of baffle plate 600A, and complementary reference point 668 may be aligned with a complementary aperture 663 of complementary baffle plate 600B. Accordingly, apertures 633 of baffle plate 600A may be in series and/or aligned with, along an axis spanning a baffle plate stack, complementary body portions 665 and/or spaces between complementary apertures 663 of complementary baffle plate 600B, and complementary apertures 663 of complementary baffle plate 600B may be in series and/or aligned with, along an axis spanning a baffle plate stack, body portion 635 and/or spaces between apertures 633 of baffle plate 600A.

Figure 7A:
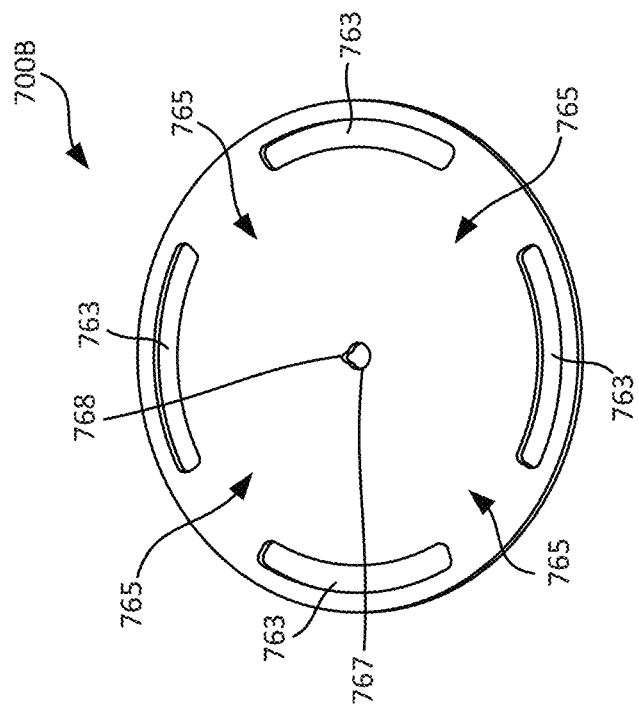
FIG. 7A illustrates yet another exemplary baffle plate, in accordance with various embodiments.
Figure 7B:
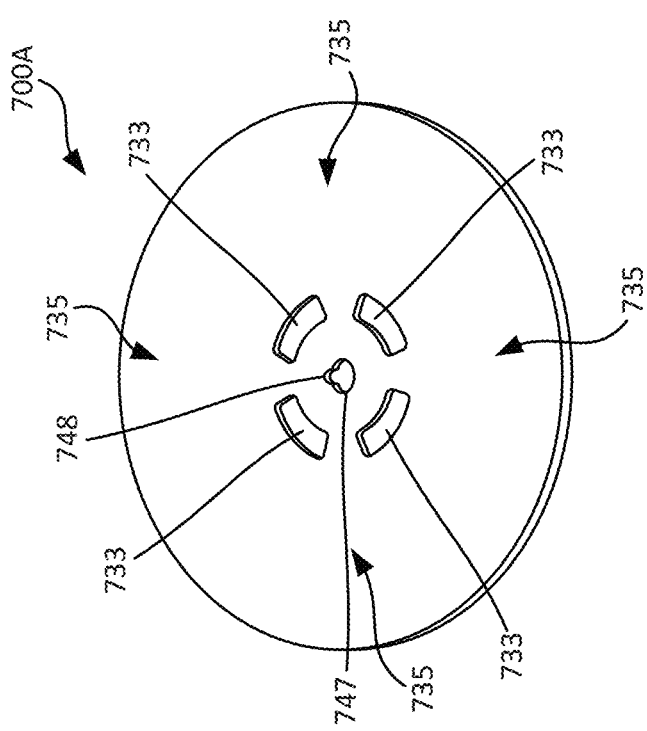
FIG. 7B illustrates yet another exemplary complementary baffle plate, in accordance with various embodiments.

FIGS. 7A and 7B depict, in accordance with various embodiments, a baffle plate 700A and a complementary baffle plate 700B. Baffle plate 700A may comprise apertures 733 and body portions 735. Baffle plate 700A may further comprise coupling hole 747 having a reference point 748. Reference point 748 may be oriented toward a body portion 735 and/or space between apertures 733. Apertures 733 may be equidistant about center of baffle plate 700A.

Complementary baffle plate 700B may comprise complementary apertures 763 and complementary body portions 765. Complementary baffle plate 700B may further comprise complementary coupling hole 767 having a complementary reference point 768. Complementary reference point 768 may be oriented toward a complementary aperture 763. Complementary apertures 763 may be equidistant about center of complementary baffle plate 700B.

The coupling rod to which baffle plate 700A and complementary baffle plate 700B may couple may comprise a cross-sectional shape complementary to coupling hole 747 and complementary coupling hole 767. That is, the coupling rod may comprise a body and a protrusion complementary to reference point 748 and complementary reference point 768. The shape and orientation of coupling hole 747 and complementary coupling hole 767, and reference point 748 and complementary reference point 768, respectively, may offset the rotational position of the baffle plates and complementary baffle plates about a coupling rod in a baffle plate stack relative to one another. Reference point 748 may be aligned with a body portion 735, or space between apertures 733, of baffle plate 700A, and complementary reference point 768 may be aligned with a complementary aperture 763 of complementary baffle plate 700B. Accordingly, apertures 733 of baffle plate 700A may be in series and/or aligned with, along an axis spanning a baffle plate stack, complementary body portions 765 and/or spaces between complementary apertures 763 of complementary baffle plate 700B, and complementary apertures 763 of complementary baffle plate 700B may be in series and/or aligned with, along an axis spanning a baffle plate stack, body portion 735 and/or spaces between apertures 733 of baffle plate 700A.

Any of the pairs of baffle plates and complementary baffle plates discussed herein (or individual plates) may be input into a baffle plate stack (e.g., to replace baffle plates 300A and complementary baffle plates 300B in baffle plate stack 400B).

In various embodiments, between each baffle plate and complementary baffle plate in a baffle plate stack, there may be a spacer configured to space the adjacent baffle plates and complementary baffle plates. For example, with reference to FIG. 4B, baffle plates 300A and complementary baffle plates 300B may be separated by spacers 303 (an example of spacers 133 in FIG. 2). A spacer may be disposed between every plate in a baffle stack (e.g., between baffle plates and complementary baffle plates, between end plates and baffle plates and/or complementary baffle plates, or the like), to achieve any desired spacing between two plates. Such spacing may achieve a desired pressure drop in the fluid airflow flowing through trap housing 103 and the apertures and complementary apertures in the baffle plates and complementary baffle plates comprised therein.

In various embodiments, a baffle plate stack may comprise at least one end plate disposed adjacent to a first and/or last baffle plate (or complementary baffle plate) in the baffle plate order. An end plate may have an end plate coupling hole similar to the coupling hole of a baffle plate and the complementary coupling hole of a complementary baffle plate, configured to engage with the coupling rod. An end plate may further comprise at least one end plate aperture disposed through an end plate body between a first and second surface of the end plate. For example, as shown in FIG. 4A, end plate 410 may comprise end plate apertures 412. End plate apertures may be disposed through an end plate in any suitable design or arrangement. In various embodiments, a portion of the end plate that does not comprise an aperture may be an end plate body portion (e.g., end plate body portion 414).

Figure 8:
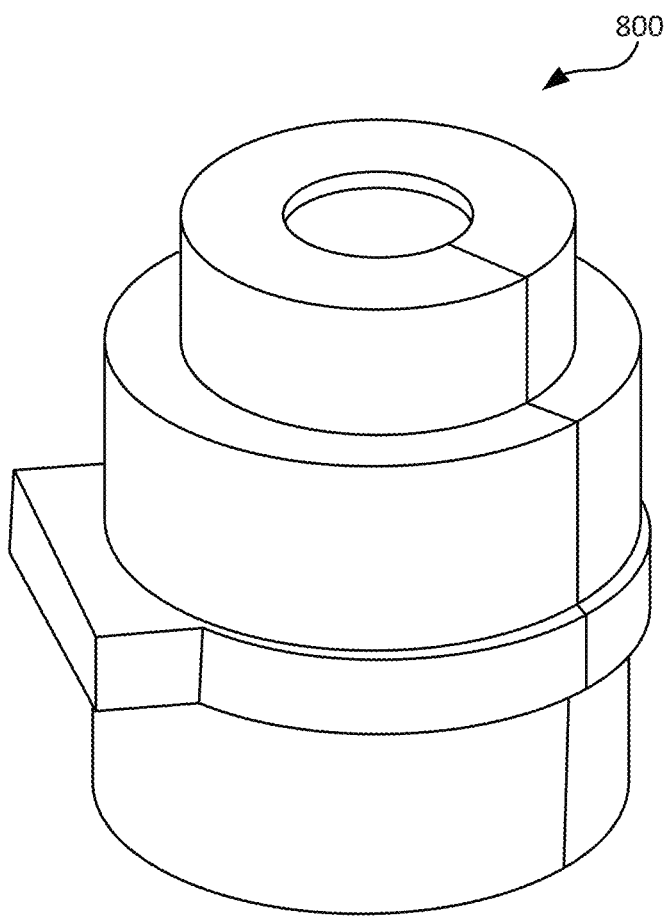
FIG. 8 illustrates a perspective view of a heater jacket for a contaminant trap system, in accordance with various embodiments.

In various embodiments, an end plate (e.g., end plate 410 in FIG. 4A) may be configured to be disposed adjacent to the internal surface of the first end or second end of trap housing 103, such that the outer surface of the end plate may be adjacent to and/or in contact with the internal surface of trap housing 103. Such a configuration may allow greater heat conductance into the baffle plate stack, e.g., from an external heat source, such as a heater jacket (e.g., heater jacket 800 depicted in FIG. 8) configured to be coupled around contaminant trap system 100 and/or trap housing 103. In various embodiments, an end plate (e.g., end plates 420 in FIG. 4B) may be configured to be spaced from the internal surface of the first end or second end of trap housing 103, such that there is a space between the outer surface of the end plate and the internal surface of trap housing 103. The space between the internal surface of trap housing 103 and an endplate may be achieved by an end plate comprising flanges (e.g., flanges 424), or a spacer disposed therebetween. Such a configuration may achieve a desired pressure drop of the fluid flow through trap housing 103, and/or provide greater area for contaminant deposition within trap housing 103 and the baffle plate stack (e.g., baffle plate stack 400B).

In various embodiments, an end plate may comprise an end plate aperture and/or end plate aperture arrangement that causes an end plate aperture to be in series and/or aligned with (e.g., along an axis spanning a baffle plate stack) an aperture disposed through the next adjacent plate in the baffle plate stack. For example, end plate apertures 422 of end plate 420 may be in series and/or aligned with, along an axis spanning a baffle plate stack, apertures 331 and/or 333 of baffle plate 300A. That way, fluid entering and flowing through trap housing 103 and baffle plate stack 400B will deposit less contaminants on plates more proximate to fluid inlet 101A, thus decreasing the risk of outgassing of contamination from contaminant trap system 100 to upstream components such as a reaction chamber.

In various embodiments, the plates in a baffle stack, including baffle plates, complementary baffle plates, and end plates, may be coupled to the coupling rod, and secured by a fastener. For example, fasteners 402 (e.g., a screw, nail, clamp, or the like) may engage with coupling rod 450 (e.g., via threading, force, and/or the like), and secure baffle plates 300A, complementary baffle plates 300B, end plates 420 and/or spacers 303.

In various embodiments, fastener 402 may be disposed in and/or coupled to a sleeve 407, which may be disposed in an end of coupling rod 450. Sleeve 407 may be configured to provide a buffer between fastener 402 and the adjacent surface of coupling rod 450 to avoid galling.

In various embodiments, one or more plates in the baffle plate stack may comprise an indicator to readily convey to a user or assembler of the baffle plate stack which plate is disposed in which baffle plate stack position. Therefore, in various embodiments, for example, baffle plates 300A may comprise indicator 304 (e.g., a notch) to readily indicate that the notched or otherwise marked plate is a baffle plate 300A. Accordingly, a user or assembler of the baffle plate stack may be able to readily discern whether the correct order of baffle plates and complementary baffle plates is achieved. Any of the plates of the baffle plate stacks discussed herein may comprise an indicator.

In various embodiments, a baffle plate stack may be palindromic, such that the order of components is the same from either end of the baffle plate stack. As illustrated in FIG. 4B, baffle plate stack 400B begins and ends with an end plate 420, and therebetween, an odd number of baffle plates 300A alternating in a baffle plate order with an even number of complementary baffle plates 300B such that the baffle plate order starts and ends with a baffle plate 300A. Accordingly, someone assembling a contaminant trap system may insert baffle plate stack 400B into trap housing 103 without worry about whether baffle plate stack 400B is right side up or upside down.

The components of the systems discussed herein (e.g., the trap housing, baffle plates, etc.) may be comprised of any suitable material such as metal or metal alloy (e.g., steel, aluminum, aluminum alloy, or the like), metal oxides, ceramic materials, and/or the like.

In various embodiments, any surface of a baffle plate stack or other contaminant trap system component that will interact with fluid flowing through a contaminant trap system may receive contaminant deposit (which is the objective of the methods and systems discussed herein, in order to remove the contaminant from the fluid to avoid contamination of downstream reactor system components). Therefore, to increase available surface area of the components, the surfaces may be textured (e.g., by bead blasting). For example, the surfaces of the baffle plates and complementary baffle plates (including the outer edges thereof), spacers, interior wall of the trap housing, the edges of the apertures and complementary apertures, and/or any other surface may be textured.

In various embodiments, to increase available surface area of a baffle plate or other contaminant trap system component, such a component may comprise (i.e., may be at least partially made of) a sintered material (e.g., sintered material 350 of baffle plate 300A, shown in FIG. 3A). The sintered material may comprise any suitable material, such as a metal, metal alloy, metal oxide, ceramic material, and/or the like. For example, the sintered material may comprise stainless steel, aluminum, an aluminum alloy, aluminum oxide, boron nitride, and/or the like.

To form a contaminant trap system component comprising a sintered material, a powder material (e.g., comprising any of the materials discussed herein, such as metal, metal alloy, metal oxide, ceramic, etc.), may be pressed together to form an object (e.g., a sheet or block of sintered material). The powder material may be pressed under any suitable conditions, including any suitable temperature or pressure, and for any suitable duration to achieve the object comprising sintered material. The object comprising a sintered material may be formed into any desired shape to form the contaminant trap system component. For example, the object comprising a sintered material may be cut (e.g., via machining, laser cutting, and/or the like) to form a desired shape, such as a baffle plate having any desired configuration (e.g., any of the baffle plate, or complementary baffle plate, configurations discussed herein).

Figure 13:
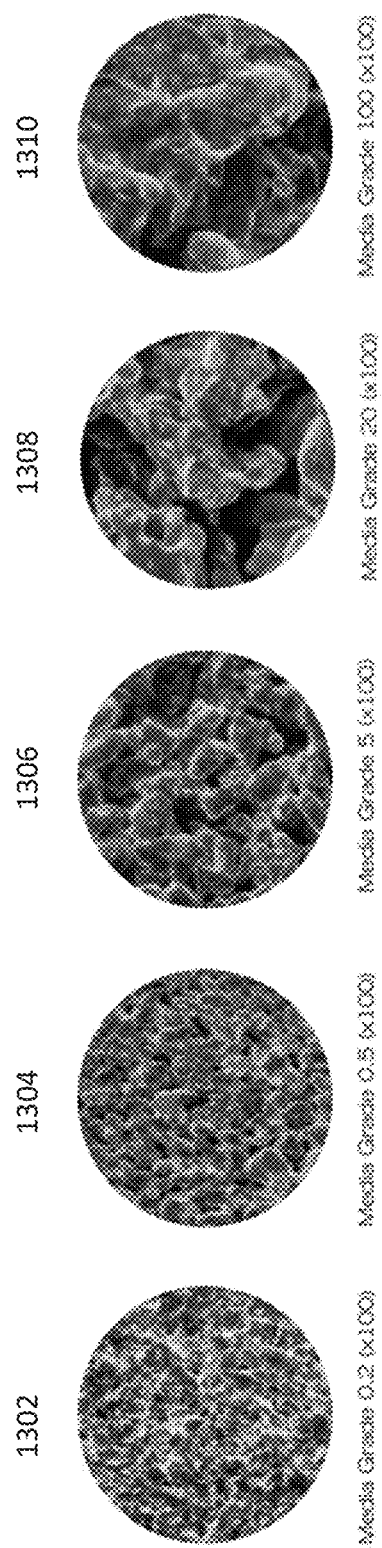
FIG. 13 illustrates exemplary sintered materials with various media grades, in accordance with various embodiments.

In various embodiments, the powder used to form the sintered material contaminant trap system component may comprise any suitable size. For example, the sintered material may be formed from particles ranging in size from 0.2 media grade to 100 grade media ("media grade," or other similar term, being the particle size in micrometers), 0.2 to 5 media grade, 0.5 to 5 media grade, 5 to 100 media grade, 5 to 20 media grade, or 20 to 100 media grade. With reference to FIG. 13, for more tightly or densely packed sintered material, a relatively smaller powder material may be used, such as sintered material 1302 comprised of grade 0.2 media. For relatively less tightly or densely packed sintered material, a relatively larger powder material may be used, such as sintered material 1310 comprising grade 100 media. Sintered materials 1304, 1306, and 1308 depict other powder sizes of 0.5, 5, and 20 media grade, respectively, to create sintered material. As shown in FIG. 13, the spaces between the sintered material (i.e., the pores within the sintered media) provide significant space for fluid to travel therein, and the relatively massive amount of surface area of the sintered material provides huge numbers of sites upon which contaminants may deposit and be trapped. In various embodiments, fluid may pass at least partially through the sintered material of a trap contaminant system component. In various embodiments, a trap contaminant system component comprising a sintered material may comprise surface area that is over one thousand times greater than the surface area of a trap contaminant system component comprising solid material (i.e., without the porous structure of sintered material). Thus, a trap contaminant system component comprising sintered material may be much more effective and efficient at capturing contaminants, allowing longer use of the trap contaminant system components, and less frequent required cleaning and/or replacement.

In various embodiments, the components of contaminant trap system 100 may be clamped and/or sealed together by clamping ring 144. A clamping ring 144 may be disposed around upper housing 103A and/or lower housing 103B, and may be configured to be tightened to hold components of contaminant trap system 100 together.

In various embodiments, a trap structure comprised in a contaminant trap system may comprise structures for trapping contaminants other than a baffle plate stack, discussed above. For example, with reference to FIGS. 10A and 10B, a contaminant trap system may comprise a trap structure 1000 disposed in the trap housing (e.g., trap housing 103 shown in FIG. 2) comprising a plurality of rods 1055. Rods 1055 may be arranged in an arrangement 1050 to direct fluid flowing between rods 1055 along a desired path. Rods 1055 may span between components which may provide stability for rods 1055 within trap structure 1000. For example, rods 1055 may be coupled to and/or span between a baffle plate 1010 and a base plate 1020. Rods 1055 may be substantially perpendicular to the baffle plate 1010 and/or base plate 1020, and/or substantially parallel to an axis spanning between the fluid inlet 101A and fluid outlet 101B of the trap housing 103 (shown in FIG. 2) (as used in this context, the term "substantially" means plus or minus 20 degrees from perpendicular or parallel, respectively). In various embodiments, the rods in the trap structure may be integral or monolithic with the baffle plate and/or base plate.

Figure 10A:
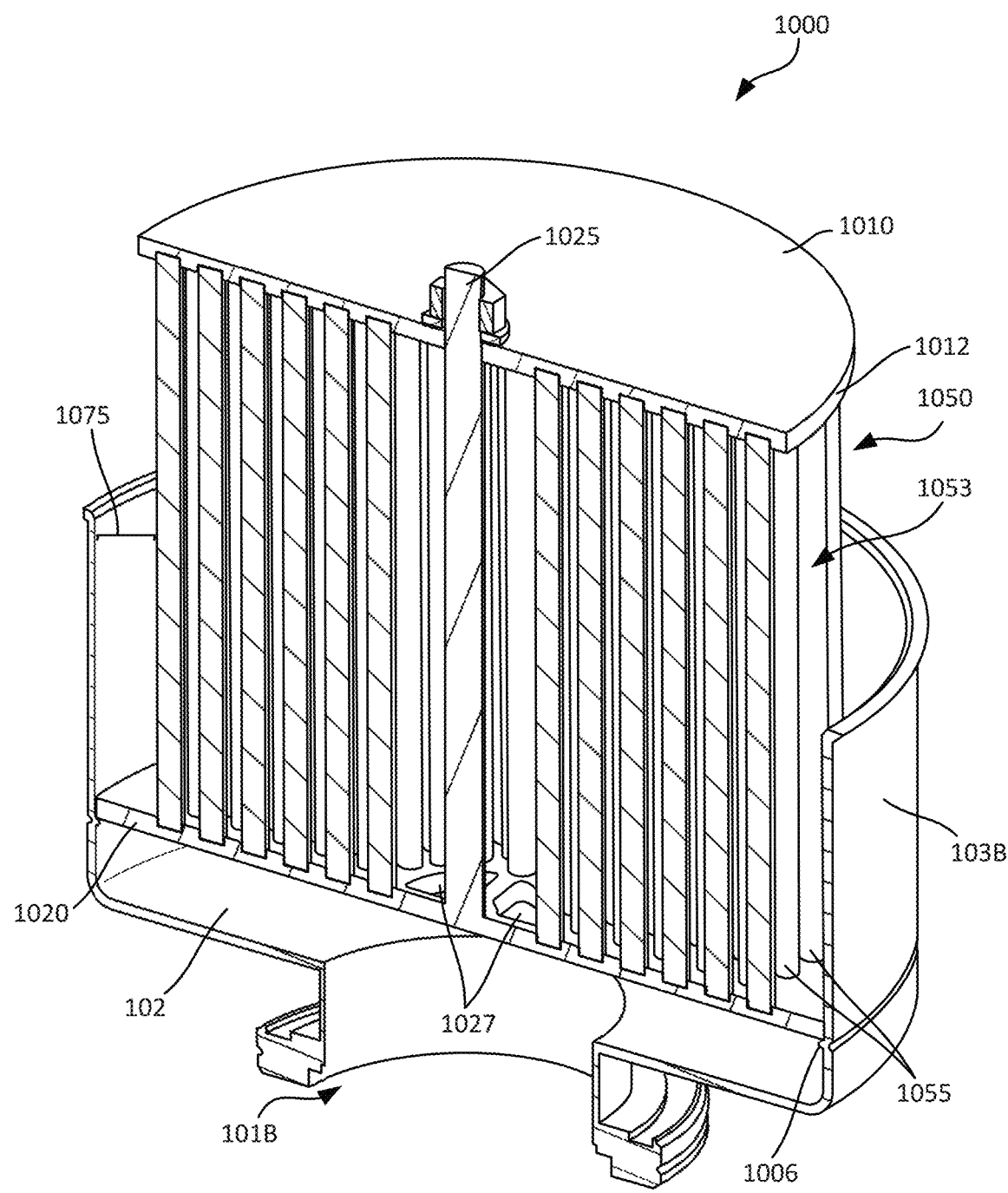
FIG. 10A illustrates a cross-sectional view of an exemplary trap structure, in accordance with various embodiments.
Figure 10B:
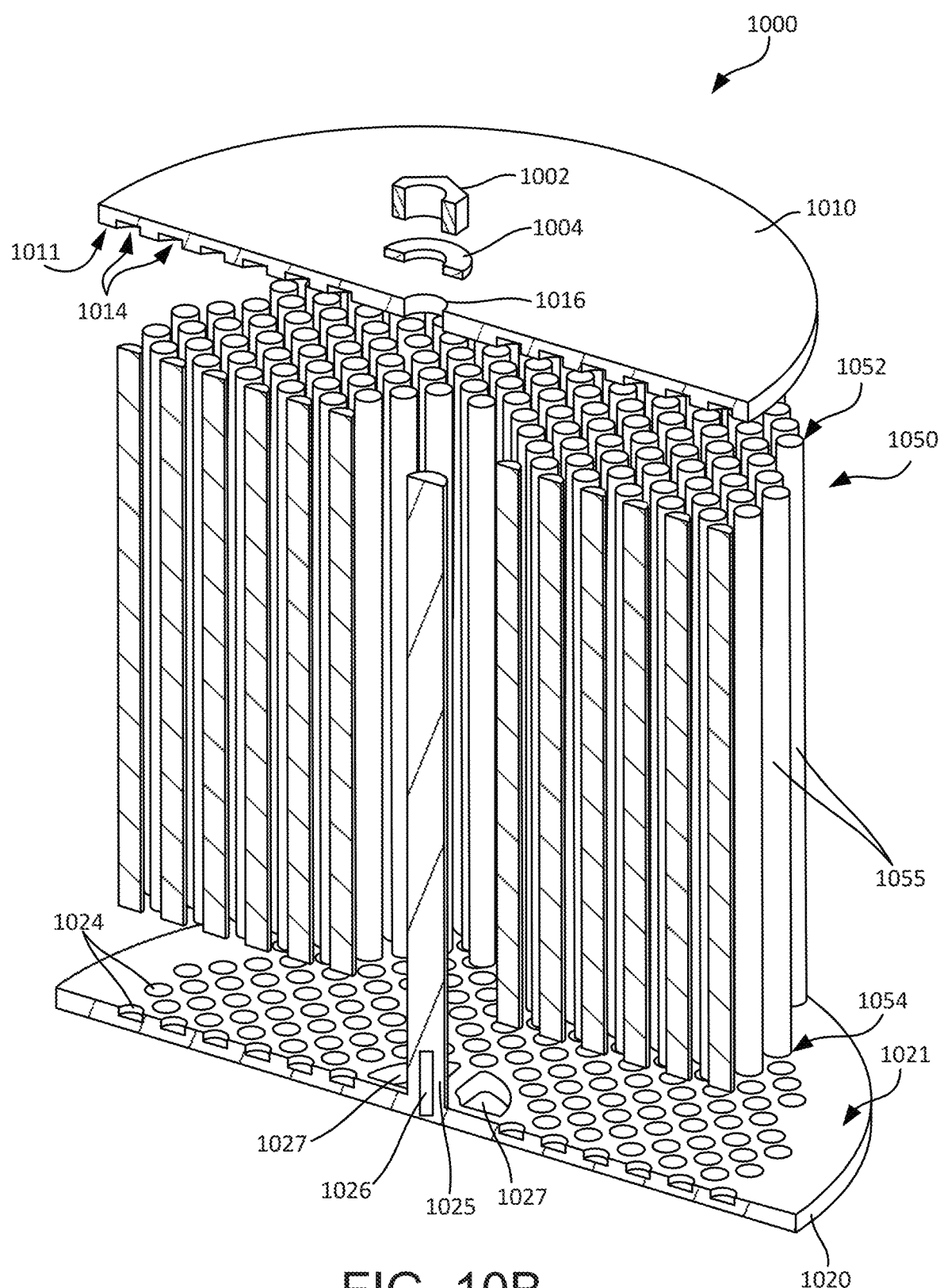
FIG. 10B illustrates an exploded view of the cross section of the trap structure of FIG. 10A, in accordance with various embodiments.

In various embodiments, as depicted in FIGS. 10A and 10B, baffle plate 1010 may comprise recesses 1014 disposed into an inner side 1011 of baffle plate 1010. Recesses 1014 may comprise a shape that is complementary to the cross-sectional shape of a respective rod 1055. A first end 1052 of each rod 1055 may be disposed into a respective recess 1014, thus coupling rods 1055 to baffle plate 1010. Similarly, in various embodiments, base plate 1020 may comprise recesses 1024 disposed into an inner side 1021 of base plate 1020 (inner side 1021 of base plate 1020 may face baffle plate 1010). Recesses 1024 may comprise a shape that is complementary to the cross-sectional shape of a respective rod 1055. A second end 1054 of each rod 1055 may be disposed into a respective recess 1024, thus coupling rods 1055 to base plate 1020. The rods of the trap structure may be coupled to a baffle plate and/or base plate by the rods resting in the respective recesses in the baffle plate and/or base plate, by tight fit within the respective recesses, threading on the base plate, baffle plate, and the rod ends to allow the rods to screw into the base plate and/or baffle plate, or the like.

In various embodiments, the rods may be coupled to a baffle plate and/or a base plate, whether or not the baffle plate and/or the base plate have recesses configured to receive the rods, in any suitable manner, for example, via welding, tightening between the baffle and base plates, adhesive, or the like.

In various embodiments, the trap structure may comprise a center support (e.g., center support 1025), which may be configured to couple two or more components of the trap structure. For example, center support 1025 of trap structure 1000 may couple baffle plate 1010 to base plate 1020, with rods 1055 disposed therebetween. Center support 1025 may be disposed through a support hole 1016 in baffle plate 1010 configured to receive center support 1025 therethrough. The shape of support hole 1016 may be complementary to the cross-sectional shape of center support 1025. Center support 1025 may be coupled and/or secured to baffle plate 1010 by a fastener (e.g., nut 1002 and/or seal 1004) disposed around center support 1025 and in contact with baffle plate 1010. In various embodiments, the fastener may comprise threading complementary to threading on the center support, such that the fastener is threaded onto the center support, and then tightened toward the base plate to push the baffle plate and base plate together. Thus, in various embodiments, rods 1055 disposed between baffle plate 1010 and base plate 1020 may be held in place by the force between baffle plate 1010 and base plate 1020 from center support 1025 and fastener 1002. The center support may be a separate component, or may be integral or monolithic with the baffle plate and/or base plate of the trap structure.

In various embodiments, rods 1055 may be disposed around (i.e., about) a center area of the base plate (e.g., the portion at or proximate center support 1025 of base plate 1020). The center area may not comprise any rods. The center area may comprise one or more flow holes (e.g., flow holes 1027) disposed through the base plate through which fluid flowing through the contaminant trap system and trap structure may flow. Thus, with airflow going through the trap housing (e.g., caused by vacuum pressure from vacuum pump 28, shown in FIG. 1), fluid flowing through the trap housing (including lower housing 103B) may be required to flow through arrangement 1050 of rods 1055, contacting rods 1055 while so doing, before exiting trap structure 1000 through flow holes 1027, and exiting the trap housing through fluid outlet 101B of the trap housing. The flow holes may be aligned and/or misaligned with fluid outlet 101B.

In various embodiments, rods in the trap structure may be disposed in any suitable arrangement. For example, rods 1055 may be disposed spaced apart (i.e., not contacting one another), or may be contacting one another, such that fluid may flow between rods 1055. The spacing of the rods may provide a convoluted path for fluid flowing through the trap structure, thus increasing the chances that the fluid will contact more surfaces and contaminants in the fluid will be deposited onto such surfaces within the trap. The rods may comprise any suitable shape or length. For example, the rods may comprise a circular cross-sectional shape (such as those shown in FIGS. 10A and 10B), or the rods may comprise, for example, a hexagonal, octagonal, triangular, or square cross-sectional shape, or any other suitable cross-sectional shape. As another example, the rods may have a cross-sectional length (e.g., the diameter of a circle) of approximately 2 millimeters (mm) ("approximately" as used in this context means plus or minus 0.5 mm). As another example, the rods may have a length (e.g., the distances spanning between the baffle plate and base plate) of approximately 20 centimeters (cm) ("approximately" as used in this context means plus or minus 5 cm). The rods may comprise a high surface-area-to-volume ratio, for example, a surface-area-to-volume ratio of at least 50:1, at least 100:1, at least 150:1, or at least 200:1. In various embodiments, the rods may comprise a textured outer surface, threading along the rods, or any other structure configured to increase the outer surface area of the rods for contaminant deposition thereon.

The rods in a trap structure may comprise any suitable material, such as steel, aluminum, or any other metal or alloy thereof, ceramic material, or the like. In various embodiments, the rods may comprise a sintered material, as discussed herein.

In various embodiments, the base plate of a trap structure (e.g., base plate 1020) may be disposed in the trap housing and support other components of the trap structure. In various embodiments, an outer side of base plate 1020 (opposite of inner side 1021) may be disposed spaced from a housing bottom surface (housing bottom surface 102) of the trap housing. To support the base plate being spaced from the trap housing bottom surface, the trap housing may comprise a support (e.g., support 1006) protruding from the trap housing to hold the base plate in place. For example, support 1006 may protrude from the interior wall of the trap housing to support base plate 1020 in place, spaced from bottom surface 102 of the trap housing. In various embodiments, a support may protrude from another surface of the trap housing, for example, from the bottom surface, to hold the base plate in place. In various embodiments, the base plate outer surface may be disposed against or adjacent to the trap housing bottom surface.

In various embodiments, the baffle plate of a trap structure (e.g., baffle plate 1010) may cause fluid flow entering the trap housing to take a certain path (e.g., a path that will increase fluid flow around and in contact with rods 1055, and/or increase removal of contaminants from the fluid). Baffle plate 1010 may reduce or prevent fluid flow from traveling around first ends 1052 of rods 1055. That is, baffle plate 1010 may form at least a partial seal between baffle plate 1010 and the first ends 1052 of rods 1055. In various embodiments, the shape of baffle plate 1010 may be smaller than a cross-sectional shape of the trap housing such that baffle plate edge 1012 does not contact the interior wall of the trap housing. Thus, there may be a space between the baffle plate edge and the interior wall of the trap housing, and/or between the rods 1055 and the interior wall of the trap housing (e.g., space 1075 between the interior wall of lower housing 103B and baffle plate edge 1012 and/or rods 1055). Baffle plate 1010 may be configured to cause at least a portion of fluid flow within the trap housing to flow around baffle plate edge 1012 toward and through arrangement 1050 of rods 1055 (e.g., through space 1075), and toward flow holes 1027.

In various embodiments, the base plate may form at least a partial seal with the interior wall of the trap housing. For example, the outer edge of base plate 1020 may be disposed against or adjacent to the interior wall of lower housing 103B, such that little or no fluid may pass therebetween. Therefore, the fluid flowing through trap structure 1000 may be directed around baffle plate 1010 (and/or through a baffle plate comprising holes disposed therethrough) to flow through the arrangement 1050 of rods 1055, and exit trap structure 1000 through flow holes 1027. Thus, contaminants in the fluid may deposit on the surfaces of the trap structure (e.g., the outer surfaces 1053 of rods 1055, baffle plate 1010, base plate 1020, etc.) with little or no fluid flow between base plate 1020 and the interior wall of the trap housing.

The arrangement of components of trap structure 1000 may allow greater heat conductance therethrough. Heating a trap structure may allow for increased growth rates of contaminant films on the trap system components, and improved trapped contaminant film properties such as increased density and decreased flaking. Thermal energy may readily travel through the base plate, rods, and/or baffle plate, whether the thermal energy is provided externally and/or internally. In various embodiments, trap structure 1000 may be heated externally, for example by a heater jacket (e.g., heater jacket 800 depicted in FIG. 8) being coupled around the contaminant trap system and/or trap housing comprising trap structure 1000. In various embodiments, trap structure 1000 may be heated internally, for example by a heater (e.g., heater 1026 depicted in FIG. 10B) disposed in, or coupled to, a component of trap structure 1000 (e.g., in base plate 1020 and/or center support 1025 comprising a heater 1026). Especially in embodiments in which rods 1055 comprise a metal material, such as steel or aluminum (or alloys thereof), thermal energy would readily travel between base plate 1020 (receiving thermal energy from heater 1026 and/or from a heater jacket through the trap housing), rods 1055, and baffle plate 1010.

In various embodiments, a trap structure such as trap structure 1000 comprising rods 1055 disposed between a baffle plate 1010 and a base plate 1020, in addition to providing plentiful surface area on which contaminants may deposit, may also have the benefit of reusability and easy maintenance. In response to trap structure 1000 being used and/or saturated with contaminants, the components of trap structure 1000 (e.g., rods 1055, baffle plate 1010, and base plate 1020) may be disassembled (and/or removed from the trap housing), easily cleaned, and then reassembled for subsequent use. The trap structure may be disassembled, for example, by uncoupling the fastener 1002 from center support 1025. If one or more of the components are damaged or otherwise need replacement, such a replacement can easily be completed. Other pre-existing components for trap structures are one-time use items and/or difficult to clean.

In various embodiments, a trap structure comprised in a contaminant trap system may comprise a plurality of tubes through which a fluid may flow. Each tube may comprise a bore (e.g., bores 1157) disposed therethrough for the length of the tube, allowing contaminants to deposit on inner and outer surfaces of the tubes. For example, with reference to FIG. 11, trap structure 1100 may comprise an arrangement 1150 of tubes 1155. Trap structure 1100 may be disposed in a trap housing (e.g., trap housing 103 shown in FIG. 2) such that tubes 1155 span at least partially between a trap housing top surface and bottom surface (e.g., along the direction of fluid flow through the trap housing, and/or substantially parallel to an axis spanning between the fluid inlet 101A and fluid outlet 101B of the trap housing 103 (shown in FIG. 2) (as used in this context, the term "substantially" means plus or minus 20 degrees from parallel)). The arrangement of tubes in a trap structure may be complementary to the shape of the trap housing, such that the tubes on the outer perimeter of the tube arrangement may abut or be disposed adjacent to the interior wall of the trap housing. For example, arrangement 1150 of tubes 1155 may be configured to be disposed in a hexagonal trap housing. In various embodiments, the tubes of a tube arrangement for a trap structure may comprise a circular arrangement configured to be disposed into a circular trap housing (e.g., into lower trap housing 103B shown in FIG. 10A).

Figure 11:
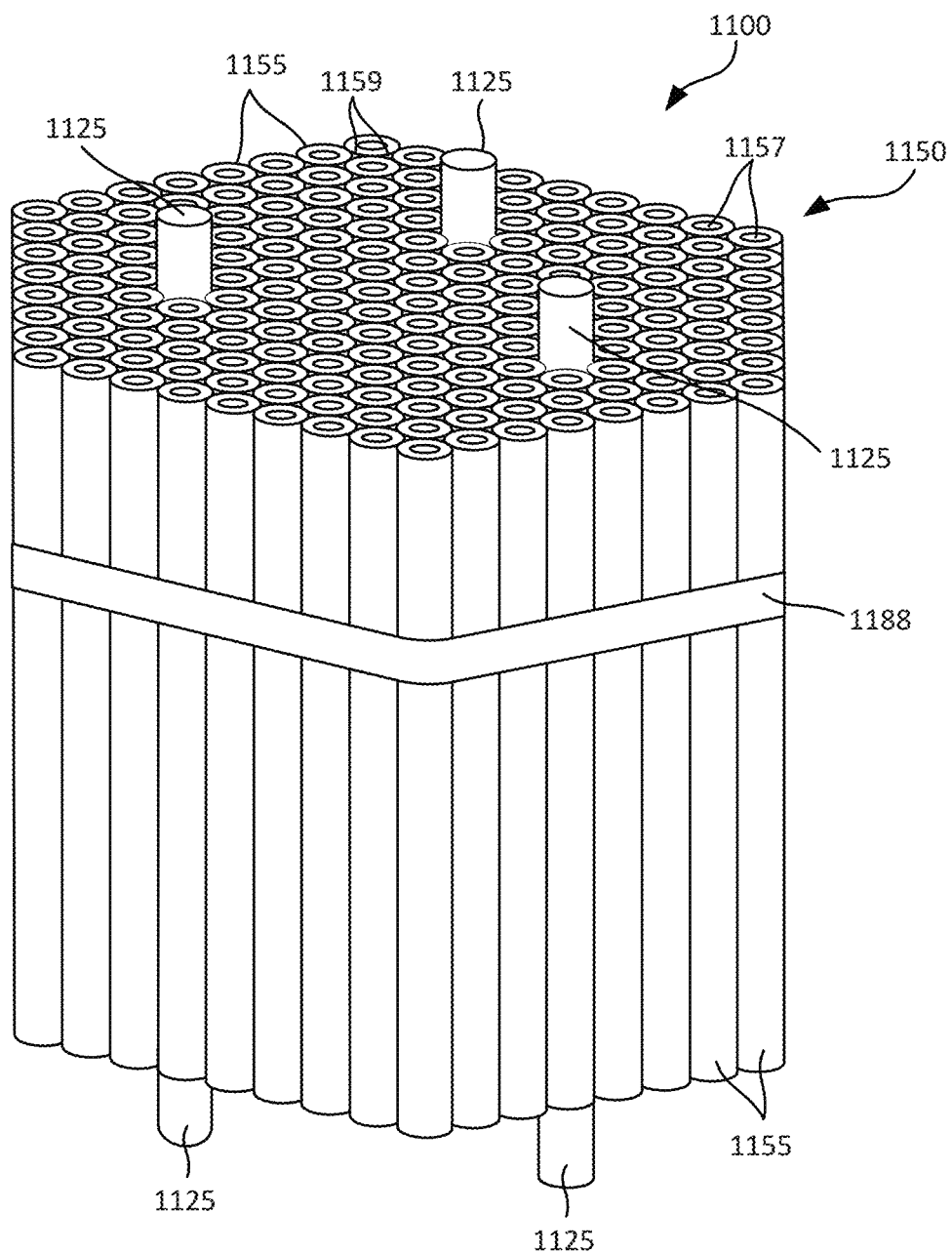
FIG. 11 illustrates an exemplary trap structure, in accordance with various embodiments.

The tubes may be arranged in any suitable manner relative to one another. The tube arrangement may be configured to limit or minimize the space between the tubes. For example, as shown in FIG. 11, in accordance with various embodiments, tubes 1155 may be packed hexagonally, such that each tube 1155 (except tubes on the outer perimeter) may be surrounded by six tubes 1155. Therefore, each tube 1155 (except tubes on the outer perimeter) may abut or be in contact with six other tubes 1155. This hexagonal packing allows uniform packing of tubes 1155 and limits the space therebetween, providing dense packing with circular tubes. Such dense packing prevents shifting of the tubes relative to one another. Also, the hexagonal packing of tubes forms triangular spaces (e.g., spaces 1159) having concave sides between the contacting tubes. These spaces between tubes allow for additional space for fluid to flow through and additional surface area (on the outside of the tubes) upon which contaminants may deposit. The hexagonal packing of tubes does not necessarily apply to the outer shape of the tube arrangement, and may be implemented in a tube arrangement having a circular outer shape.

The tubes in a trap structure may comprise any suitable shape or dimensions. In various embodiments, the tubes may comprise a circular cross-sectional outer shape (e.g., tubes 1155), or any other suitable cross-sectional shape configured to allow a desired arrangement of the tubes. In various embodiments, the tube bores may comprise a circular cross-sectional shape (e.g., bores 1157), or any other suitable cross-sectional bore shape. In various embodiments, the tubes may have a cross-sectional length (e.g., an outer diameter of tubes 1155) of approximately 2 millimeters (mm). In various embodiments, the tubes may have an inner diameter (e.g., the length across the bores, such as the diameter of bores 1157) of approximately 1 mm ("approximately" as used in this context means plus or minus 0.5 mm). In various embodiments, the tubes may have a length of approximately 20 centimeters (cm) ("approximately" as used in this context means plus or minus 5 cm). The tubes may comprise a high surface-area-to-volume ratio, for example, a surface-area-to-volume ratio of at least 50:1, at least 100:1, at least 150:1, or at least 200:1. For example, tubes in a hexagonal packing arrangement that are approximately 20 cm in length, having an outer diameter of about 2 mm and an inner diameter of 1 mm, filling a trap housing having a diameter of about 19 cm, provide significant surface area to receive contaminant deposition. The surface area of the tube bores in such an example would provide approximately six square meters of trapping surface, and the gaps between the tubes (e.g., spaces 1159) would provide slightly less than six square meters, for a total surface area of about twelve square meters. Assuming a typical deposition process in a reactor produces three square micrometers of contaminant deposit within a trap, the surface area provided by the trap structures comprising the tubes in the arrangement and dimensions discussed would allow the same trap structure to be used for numerous deposition cycles before needing maintenance or replacement.

In various embodiments, the outer and/or inner surfaces of the tubes may comprise a textured outer surface, threading along the outer and/or inner surfaces, or any other structure configured to increase the outer surface area of the tubes for contaminant deposition thereon.

The tubes in a trap structure may comprise any suitable material, such as steel, aluminum, or any other metal or alloy thereof, ceramic material, or the like. In various embodiments, the tubes may comprise a sintered material, as discussed herein.

In various embodiments, the tubes may be coupled in any suitable manner such as adhesive, welding, and/or tight fit within the trap housing. As shown in FIG. 11, tubes 1155 are coupled together to maintain arrangement 1150 by tensioning device 1188, which may be a clamping ring (similar to clamping ring 114), a belt, an elastic band, or the like.

In various embodiments, an arrangement 1150 of tubes 1155 may comprise at least one support 1125. A support 1125 may be a rod or other structure that protrudes at least outwardly from the bottom of arrangement 1150 (i.e., a support 1125 extends closer to a bottom surface of a trap housing than tubes 1155). In various embodiments, an arrangement of tubes may comprise more than one support (e.g., three supports 1125, as shown in FIG. 11). Supports 1125 may be configured to support the arrangement 1150 of tubes 1155 such that there is a space between the bottom of tubes 1155 and a bottom surface of the trap housing (e.g., bottom surface 102 if trap structure 1100 were disposed in lower trap housing 103B, shown in FIG. 10A). Similarly, when disposed in a trap housing, there may be a space between the tops of tubes 1155 and a top surface of the trap housing. For example, the tube arrangement 1150 may simply rest in a position within the trap housing that causes a space between the tops of tubes 1155 and a top surface of the trap housing (e.g., because of the way upper and lower housings of the trap housing fit together). As another example, supports 1125 may also protrude outwardly from the top of the arrangement 1150 (i.e., a support 1125 extends closer to a top surface of a trap housing than tubes 1155). Thus, if a lid or upper housing of a trap housing is placed on the trap structure, the lid or upper housing will come to rest against the tips of supports 125, thus allowing a space between the top surface of the trap housing and the tops of tubes 1155. Such a space would allow fluid flowing into a trap housing (e.g., through fluid inlet 101A, shown in FIG. 2) to disperse and utilize more of tubes 1155 to trap contaminants.

In various embodiments, a structure, such as a baffle plate with holes, showerhead, or the like may be disposed above the tube arrangement in a trap housing to disperse fluid flowing thereto in a desired manner to increase utilization of the surface area provided by the tubes.

The arrangement of components of trap structure 1100 may allow greater heat conductance therethrough. Heating a trap structure may allow for increased growth rates of contaminant films on the trap system components, and improved trapped contaminant film properties such as increased density and decreased flaking. Thermal energy may readily travel through the trap housing, supports 1125, and/or tubes, whether the thermal energy is provided externally and/or internally. In various embodiments, trap structure 1100 may be heated externally, for example by a heater jacket (e.g., heater jacket 800 depicted in FIG. 8) being coupled around the contaminant trap system and/or trap housing comprising trap structure 1100. In various embodiments, trap structure 1100 may be heated internally, for example by a heater being disposed in the arrangement 1150 of tubes 1155. For example, a tube within the tube arrangement (e.g., a tube at or close to the center of the arrangement) may be replaced by a heater, and/or a support 125 may be, or may comprise, a heater. Especially in embodiments in which tubes 1155 comprise a metal material, such as steel or aluminum (or alloys thereof), thermal energy would readily travel through tubes 1155 and/or supports 1125 (e.g., if receiving thermal energy from a heater jacket through the trap housing or from an internal heater).

In various embodiments, a trap structure such as trap structure 1100 comprising tubes 1155, in addition to providing plentiful surface area on which contaminants may deposit, may also have the benefit of reusability and easy maintenance. In response to trap structure 1100 being used and/or saturated with contaminants, the components of trap structure 1100 (e.g., tubes 1155, supports 1125, tensioning device 1188) may be easily removed from a trap housing and/or disassembled, cleaned, and then reassembled for subsequent use. The trap structure may be disassembled, for example, by uncoupling the tensioning device 1188 from tubes 1155. If one or more of the components are damaged or otherwise need replacement, such a replacement can easily be completed.

Figure 12:
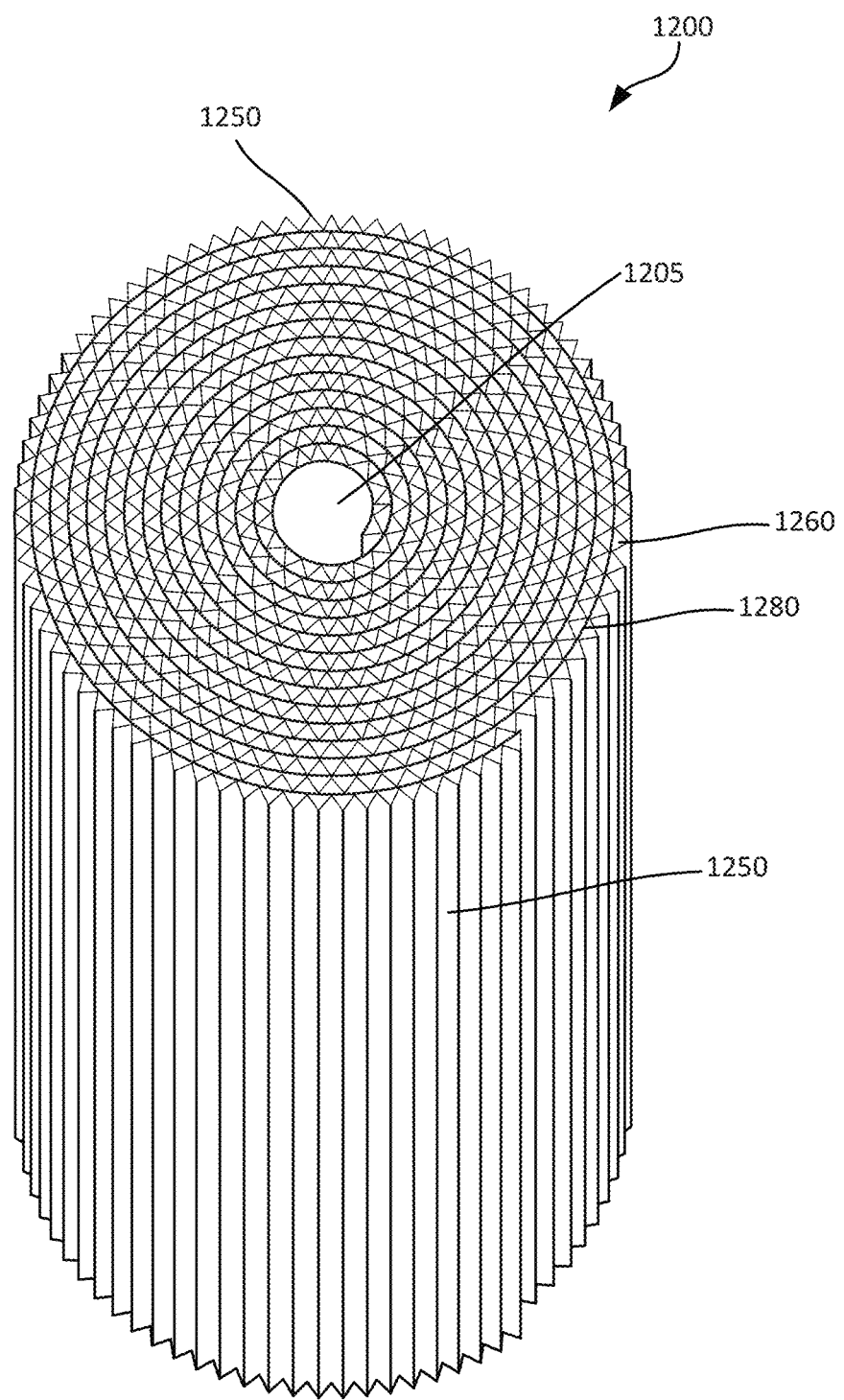
FIG. 12 illustrates an exemplary trap structure, in accordance with various embodiments.

In various embodiments, a trap structure comprised in a contaminant trap system may comprise a corrugated sheet through which fluid may flow and deposit contaminants thereon. With reference to FIG. 12, in accordance with various embodiments, a corrugated trap structure 1200 may comprise a corrugate sheet 1250 coupled to a noncorrugated sheet 1280. Spaces 1260 between corrugated sheet 1250 and noncorrugated sheet 1280 may allow fluid to flow therethrough and contaminants to deposit on the surface area provided therein by the sheets. Corrugated trap structure 1200 may be disposed in a trap housing (e.g., trap housing 103 shown in FIG. 2) such that spaces 1260 span at least partially between a trap housing top surface and bottom surface (e.g., along the direction of fluid flow through the trap housing). Sheets 1250 and 1280 may be spiraled in any suitable shape (e.g., in a circular shape, such as that shown in FIG. 12, or a square, triangular, rectangular, hexagonal, or octagonal shape). The outer shape of the spiraled sheets may be complementary to the shape of the trap housing in which the trap structure will be disposed. For example, corrugated trap structure 1200 may be configured to be disposed in a circular trap housing, such as trap housing 103 shown in FIG. 2. Thus, the corrugated sheet or noncorrugated sheet may abut or be disposed adjacent to the interior wall of the trap housing. The corrugated and noncorrugated sheets may be spiraled or arranged such that a middle void 1205 may be decreased or minimized to cause fluid flowing therethrough to flow through spaces 1260 as opposed to other paths through corrugated trap structure 1200.

In various embodiments, corrugated trap structure 1200 may comprise at least one support (e.g., support 1125 shown in FIG. 11). A support may be a rod or other structure that protrudes outwardly from the bottom and/or top of corrugated trap structure 1200. Such a support may be configured to support corrugated trap structure 1200 such that there is a space between the bottom and/or top of corrugated trap structure 1200 and a bottom and/or top surface of the trap housing. Therefore, a space may be created between the bottom of corrugated trap structure 1200 and a bottom surface of the trap housing and/or between the top of corrugated trap structure 1200 and a top surface of the trap housing. Such a space would allow fluid flowing into a trap housing (e.g., through fluid inlet 101A, shown in FIG. 2) to disperse and utilize (i.e., flow through) more of spaces 1260 to trap contaminants.

The corrugated trap structure may comprise any suitable material, such as steel, aluminum, or any other metal or alloy thereof, ceramic material, or the like. In various embodiments, the corrugated trap structure may comprise a sintered material, as discussed herein.

In various embodiments, a structure, such as a baffle plate with holes, showerhead, or the like may be disposed above the corrugated trap structure in a trap housing to disperse fluid flowing thereto in a desired manner to increase utilization of the surface area provided for contaminant deposition.

The arrangement of components of corrugated trap structure 1200 may allow greater heat conductance therethrough. Heating a trap structure may allow for increased growth rates of contaminant films on the trap system components, and improved trapped contaminant film properties such as increased density and decreased flaking. Thermal energy may readily travel through corrugated trap structure 1200, whether the thermal energy is provided externally and/or internally. In various embodiments, corrugated trap structure 1200 may be heated externally, for example by a heater jacket (e.g., heater jacket 800 depicted in FIG. 8) being coupled around the contaminant trap system and/or trap housing comprising corrugated trap structure 1200. In various embodiments, corrugated trap structure 1200 may be heated internally, for example by a heater being disposed through void 1205 or a heater comprised in a support disposed through void 1205. Especially in embodiments in which corrugated trap structure 1200 comprises a metal material, such as steel or aluminum (or alloys thereof), thermal energy would readily travel through corrugated trap structure 1200 (e.g., if receiving thermal energy from a heater jacket through the trap housing or from an internal heater).

In various embodiments, the contaminant trap systems, and components comprised therein, may comprise no adhesive or other coupling material to couple any components. The absence of an adhesive, epoxy, or other coupling material mitigates the risk of such a coupling material outgassing and traveling to the reaction chamber, acting as a contaminant therein. Additionally, without such a coupling material, components of the systems discussed herein may not be susceptible to degradation at elevated temperatures, for example, greater than 120° C. Therefore, a contaminant trap system (e.g., contaminant trap system 100 in FIG. 2) and trap structures comprised therein may be moved closer to a reaction chamber of a reactor system (e.g., reaction chamber 4 of reactor system 50 in FIG. 1) than a contaminant trap system comprising a coupling material. Accordingly, a reactor system having a contaminant trap system in accordance with the embodiments discussed herein may be more compact and/or have more feasible configurations and special arrangements.

The contaminant trap systems discussed herein are configured to increase the surface area with which a fluid flowing therethrough may contact to allow more opportunity for contaminant deposition on such surface area. Thus, for example, as discussed herein, the apertures of a baffle plate may not be aligned with and/or in series with the complementary apertures of an adjacent complementary baffle plate in the baffle plate stack. As another example, rods (e.g., rods 1055) may be arranged such that there is a nonlinear path from an outer perimeter of the arrangement of rods to the flow holes (e.g., flows holes 1027) allowing fluid to exit the trap structure. As yet another example, tubes (e.g., tubes 1155) and/or spaces (e.g., spaces 1260) through a corrugated trap structure (e.g., corrugated trap structure 1200) may allow contaminants within a fluid to deposit on surfaces within the tubes or paths through a corrugated trap structure.

Figure 9:
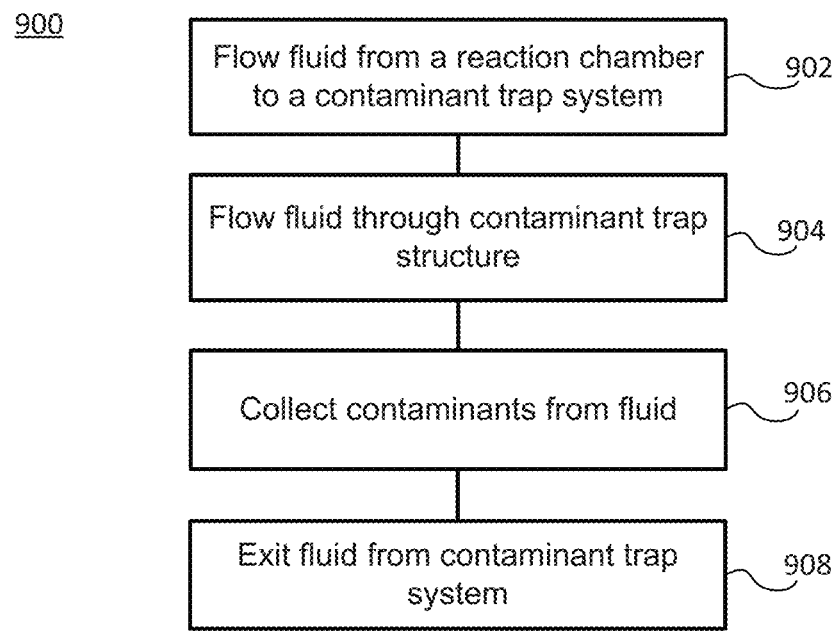
FIG. 9 illustrates a method of flowing fluid through a contaminant trap system of a reactor system, in accordance with various embodiments.

FIG. 9 illustrates a method 900 of flowing fluid through a contaminant trap system in a reaction system, in accordance with various embodiments. With additional reference to FIGS. 2 and 4B, a fluid may flow from a reaction chamber (e.g., reaction chamber 4 in FIG. 1) to a contaminant trap system (e.g., contaminant trap system 100 in FIG. 2) (step 902). Contaminant trap system 100 may comprise a fluid inlet 101A and a fluid outlet 101B of a trap housing 103. The fluid may flow into contaminant trap system 100 through fluid inlet 101A. The fluid may comprise materials which the contaminant trap system is configured to remove from the fluid (e.g., contaminants).

In various embodiments, the fluid may flow through the contamination trap structure (step 904) comprised in the contaminant trap system. The trap structure may comprise any suitable structural arrangement upon which to collect contaminants form the fluid, such as those discussed herein. In various embodiments, the trap structure in the contamination trap may comprise a baffle plate stack 400B (e.g., an example of baffle plate stack 130 in FIG. 2) in contaminant trap system 100. Therefore, the fluid may flow through a plurality of baffle plates 300A alternating positions in a baffle plate order with a plurality of complementary baffle plates 300B. The fluid may also flow through at least one end plate (e.g., end plate 420) comprised in the baffle plate stack on either end of the baffle plate stack. In various embodiments, the fluid may flow through trap structures comprising rods, tubes, and/or corrugated and noncorrugated sheets, as discussed herein.

To flow through the baffle plate stack 400B, the fluid may flow through a first end plate 420 via end plate apertures 422 and/or around the outer edge of end plate 420. In flowing through the baffle plate order of baffle plate stack 400B, the fluid may contact the top surface 322 and bottom surface 324 of baffle plates 300A, the complementary top surface 352 and complementary bottom surface 354 of complementary baffle plates 300B, and pass through apertures 331 and 333 of baffle plates 300A and complementary apertures 361 and 363 of complementary baffle plates 300B. Apertures 331 and 333 of baffle plates 300A may be disposed through baffle plates 300A and aligned with complementary baffle plates 300B such that apertures 331 and 333 may be aligned with complementary body portions 365 of complementary baffle plates 300B. Therefore, in response to flowing through apertures 331 and 333 of a baffle plate 300A, the fluid may contact complementary body portions 365 of a subsequent complementary baffle plate 300B in baffle plate stack 400B. In response to contacting complementary body portions 365 of the next complementary baffle plate 300B, the fluid may flow toward fluid outlet 101B and through complementary apertures 361 and 363 of such complementary baffle plate 300B. Complementary apertures 361 and 363 of complementary baffle plates 300B may be disposed through complementary baffle plates 300B and aligned with baffle plates 300A such that complementary apertures 361 and 363 may be aligned with body portions 335 of baffle plates 300A. Therefore, in response to flowing through complementary apertures 361 and 363 of a complementary baffle plate 300B, the fluid may contact body portions 335 of a subsequent baffle plate 300A in baffle plate stack 400B. In response to contacting body portions 335 of the next baffle plate 300A, the fluid may flow toward fluid outlet 101B and through apertures 331 and 333 of such baffle plate 300A.

The fluid flow will follow this flow pattern through the baffle plate order of baffle plates 300A and complementary baffle plates 300B, until the fluid has passed the final plate in the baffle plate order. The fluid may flow through an end plate 420 on a second end of the baffle plate stack 400B, contacting the surface of such end plate 420, and flowing through end plate apertures 422. The fluid, while flowing through baffle plate stack 400B, may additionally flow between the outer edges of baffle plates 300A and complementary baffle plates 300B and the interior wall surface of outer wall 105, interacting with and contacting those surfaces.

In various embodiments, to flow through a trap structure with rods (e.g., trap structure 1000), the fluid may contact and flow around baffle plate 1010 into space 1075. Then, the fluid may travel through the arrangement 1050 of rods 1055, contacting rods 1055 before exiting trap structure 1000 through flow holes 1027.

In various embodiments, to flow through a trap structure with tubes (e.g., trap structure 1100), the fluid may flow through tubes 1155 before exiting trap structure 1100.

In various embodiments, to flow through a corrugated trap structure (e.g., corrugated trap structure 1200), the fluid may flow through spaces 1260 before exiting corrugated trap structure 1200.

In response to the fluid contacting the surfaces described above (e.g., baffle plates, complementary baffle plates, end plates, interior wall surface of outer wall 105, rods 1055, tubes 1155, corrugated and noncorrugated sheets 1250 and 1280, etc.), contaminants comprised in the fluid may be deposited or collected from the fluid (step 906) on surfaces in contaminant trap system and the respective trap structure disposed therein. The surfaces and their positions relative to one another in the contaminant trap system provide increased surface area upon which such contaminant deposition may occur. Some of the surfaces may comprise texturing to provide further available surface area.

In various embodiments, the fluid may flow through fluid outlet 101B and exit from contaminant trap system (step 908).

Although exemplary embodiments of the present disclosure are set forth herein, it should be appreciated that the disclosure is not so limited. For example, although reactor and contaminant trap systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A contaminant trap system of a reactor system, comprising:
 a trap housing comprising a housing outer wall;
 a first baffle plate disposed in the trap housing, wherein the first baffle plate comprises a sintered material, wherein the first baffle plate is configured to allow a fluid to pass therethrough as the fluid passes from a first end to a second end of the trap housing, and wherein the sintered material is configured to collect contaminants from the fluid as the fluid contacts the sintered material, wherein the first baffle plate comprises:
  a first aperture spanning through a first baffle plate body between a first top baffle plate surface and a first bottom baffle plate surface of the first baffle plate; and
  a first body portion; and
 a first complementary baffle plate comprising a second sintered material, wherein the first complementary baffle plate is disposed in the trap housing in series with the first baffle plate between the first end and the second end of the trap housing, wherein the first complementary baffle plate comprises:
  a first complementary aperture spanning through a first complementary baffle plate body between a first top complementary baffle plate surface and a first bottom complementary baffle plate surface of the first complementary baffle plate; and
  a first complementary body portion,
 wherein the first baffle plate and the first complementary baffle plate are comprised in a baffle plate stack, and
 wherein the first baffle plate and the first complementary baffle plate are disposed in a baffle plate orientation in the trap housing wherein at least a portion of the first aperture of the first baffle plate and at least a portion of the first complementary body portion of the first complementary baffle plate are aligned along a first axis spanning between the first end and the second end of the trap housing, and such that at least a portion of the first body portion of the first baffle plate and at least a portion of the first complementary aperture of the first complementary baffle plate are aligned along a second axis spanning between the first end and the second end of the trap housing.

2. The contaminant trap system of claim 1, wherein the sintered material comprises at least one of a metal material or a ceramic material.

3. The contaminant trap system of claim 1, further comprising a coupling rod disposed in the trap housing and spanning between the first end and the second end of the trap housing,
 wherein the first baffle plate comprises a first coupling hole disposed through the first baffle plate body, wherein the coupling rod is disposed through the first coupling hole, and
 wherein the first complementary baffle plate comprises a first complementary coupling hole disposed through the first complementary baffle plate body, wherein the coupling rod is disposed through the first complementary coupling hole.

4. The contaminant trap system of claim 3, wherein the coupling rod comprises a noncircular cross-section, wherein the first coupling hole of the first baffle plate and the first complementary coupling hole of the first complementary baffle plate each comprise a shape complementary to the noncircular cross-section of the coupling rod.

5. The contaminant trap system of claim 4, wherein a reference point of the first coupling hole is disposed in a first orientation, and a complementary reference point of the first complementary coupling hole is disposed in a first complementary orientation, wherein the first orientation and the first complementary orientation dispose the first baffle plate and the first complementary baffle plate about the coupling rod to achieve the baffle plate orientation.

6. The contaminant trap system of claim 5, further comprising a spacer between the first baffle plate and the first complementary baffle plate to provide a space therebetween.

7. The contaminant trap system of claim 1, further comprising a second baffle plate disposed in the trap housing, wherein the second baffle plate comprises:
  a second aperture spanning through a second baffle plate body between a second top baffle plate surface and a second bottom baffle plate surface of the second baffle plate; and
  a second body portion,
  wherein the second baffle plate is disposed in the trap housing such that the first complementary baffle plate is between the first baffle plate and the second baffle plate, and wherein the baffle plate orientation further comprises at least a portion of the second aperture of the second baffle plate and at least a portion of the first complementary body portion of the first complementary baffle plate being aligned along the first axis, and at least a portion of the second body portion of the second baffle plate and at least a portion of the first complementary aperture of the first complementary baffle plate being aligned along the second axis.

8. The contaminant trap system of claim 7, wherein the first baffle plate and the second baffle plate comprise an identical design.

9. The contaminant trap system of claim 5, wherein the baffle plate stack further comprises an end plate disposed such that, at least one of:
  the first baffle plate is between the end plate and the first complementary baffle plate, or
  the first complementary baffle plate is between the end plate and the first baffle plate,
  wherein the end plate comprises an end plate aperture and an end plate body portion.

10. The contaminant trap system of claim 1, wherein the housing outer wall of the trap housing comprises an interior wall surface, wherein an outer edge of at least one of the first baffle plate and the first complementary baffle plate is disposed adjacent to the interior wall surface such that at least a partial seal is formed between the outer edge of at least one of the first baffle plate and the first complementary baffle plate, and the interior wall surface.

11. The contaminant trap system of claim 10, wherein the interior wall surface of the trap housing is textured.

12. The contaminant trap system of claim 1, further comprising a heater jacket coupled to the trap housing.

13. The contaminant trap system of claim 1, wherein the first aperture of the first baffle plate is comprised in a radially inward portion of the first baffle plate, and wherein the first complementary aperture of the first complementary baffle plate is comprised in a radially outward portion of the first complementary baffle plate.

14. A baffle plate stack for a contaminant trap system, comprising:
  a plurality of baffle plates, at least one of which comprises a sintered material, wherein each baffle plate of the plurality of baffle plates comprises:
    an aperture spanning through a baffle plate body of each baffle plate of the plurality of baffle plates; and
    a body portion; and
  a plurality of complementary baffle plates, at least one of which is comprised of a second sintered material, wherein each complementary baffle plate of the plurality of complementary baffle plates comprises:
    a complementary aperture spanning through a complementary baffle plate body of each complementary baffle plate of the plurality of complementary baffle plates; and
    a complementary body portion,
  wherein the plurality of baffle plates and the plurality of complementary baffle plates are disposed in a baffle plate order between a first end and a second end of the baffle plate stack in which the plurality of baffle plates alternates with the plurality of complementary baffle plates, such that no two of the plurality of baffle plates and no two of the plurality of complementary baffle plates are adjacent in the baffle plate order,
  wherein the plurality of baffle plates and the plurality of complementary baffle plates are disposed in a baffle plate orientation wherein at least a portion of the apertures of the plurality of baffle plates and at least a portion of the complementary body portions of the plurality of complementary baffle plates are aligned along a first axis spanning between the first end and the second end of the baffle plate stack, and such that at least a portion of the body portions of the plurality of baffle plates and at least a portion of the complementary apertures of the plurality of complementary baffle plates are aligned along a second axis spanning between the first end and the second end of the baffle plate stack.

15. The baffle plate stack of claim 14, further comprising a coupling rod coupled to each of the plurality of baffle plates and each of the plurality of complementary baffle plates, wherein the coupling rod spans between the first end and the second end of the baffle plate stack,
  wherein the coupling rod comprises a cross-section,
  wherein each of the plurality of baffle plates comprises a coupling hole and each of the plurality of complementary baffle plates comprises a complementary coupling hole, wherein the coupling holes and the complementary coupling holes each comprise a shape complementary to the cross-section of the coupling rod.

16. The baffle plate stack of claim 15, wherein the cross-section of the coupling rod is noncircular, wherein the coupling hole of each of the plurality of baffle plates is disposed in a first orientation, and the complementary coupling hole of each of the plurality of complementary baffle plates is disposed in a second orientation, wherein the first orientation and the second orientation dispose the plurality of baffle plates and the plurality of complementary baffle plates about the coupling rod to achieve the baffle plate orientation.

17. The baffle plate stack of claim 14, wherein there is one more of the plurality of baffle plates than the plurality of complementary baffle plates, such that baffle plate stack comprises the same order of the plurality of baffle plates and the plurality of complementary baffle plates from the first end and the second end of the baffle plate stack.

18. A baffle plate stack for a contaminant trap system, comprising:
  a first baffle plate comprising a sintered material, wherein the first baffle plate comprises:
    a first aperture spanning through a first baffle plate body between a first top baffle plate surface and a first bottom baffle plate surface of the first baffle plate; and
    a first body portion; and
  a first complementary baffle plate comprising a second sintered material, wherein the first complementary baffle plate is in series with the first baffle plate between a first end and a second end of the baffle plate stack, wherein the first complementary baffle plate comprises:
a first complementary aperture spanning through a first complementary baffle plate body between a first top complementary baffle plate surface and a first bottom complementary baffle plate surface of the first complementary baffle plate; and
a first complementary body portion, and
wherein the first baffle plate and the first complementary baffle plate are disposed in a baffle plate orientation wherein at least a portion of the first aperture of the first baffle plate and at least a portion of the first complementary body portion of the first complementary baffle plate are aligned along a first axis spanning between the first end and the second end of the baffle plate stack, and such that at least a portion of the first body portion of the first baffle plate and at least a portion of the first complementary aperture of the first complementary baffle plate are aligned along a second axis spanning between the first end and the second end of the baffle plate stack.

* * * * *